US011513085B2

(12) United States Patent
Blasenheim et al.

(10) Patent No.: US 11,513,085 B2
(45) Date of Patent: Nov. 29, 2022

(54) MEASUREMENT AND CONTROL OF WAFER TILT FOR X-RAY BASED METROLOGY

(71) Applicant: KLA Corporation, Milpitas, CA (US)

(72) Inventors: Barry Blasenheim, Campbell, CA (US); Joseph A. Di Regolo, Livermore, CA (US); Yan Zhang, Fremont, CA (US); Robert Press, San Jose, CA (US); Huy Nguyen, Los Altos, CA (US)

(73) Assignee: KLA Corporation, Milpitas, CA (US)

( * ) Notice: Subject to any disclaimer, the term of this patent is extended or adjusted under 35 U.S.C. 154(b) by 258 days.

(21) Appl. No.: 17/013,618

(22) Filed: Sep. 6, 2020

(65) Prior Publication Data

US 2021/0262950 A1    Aug. 26, 2021

Related U.S. Application Data

(60) Provisional application No. 62/979,274, filed on Feb. 20, 2020.

(51) Int. Cl.
  *G01N 23/201* (2018.01)
  *G03F 7/26* (2006.01)
  (Continued)

(52) U.S. Cl.
  CPC ....... *G01N 23/201* (2013.01); *G03F 7/70625* (2013.01); *G03F 7/70633* (2013.01);
  (Continued)

(58) Field of Classification Search
  CPC ............ G01B 2210/56; G01N 21/956; G01N 23/201; G01N 2223/6116; G03F 7/70625; G03F 7/70633
  See application file for complete search history.

(56) References Cited

U.S. PATENT DOCUMENTS 5,608,526 A    3/1997 Piwonka-Corle et al.
5,859,424 A    1/1999 Norton et al.
(Continued)

FOREIGN PATENT DOCUMENTS

KR   10-2001-0088061 A    9/2001
KR   10-0763712000 B1    10/2007
WO   2016115385 A1    7/2016

OTHER PUBLICATIONS

Lemaillet, Germer, Kline et al.,"Intercomparison between optical and x-ray scatterometry measurements of FinFET structures" by Proc. SPIE, v.8681, p. 86810Q (2013).
(Continued)

*Primary Examiner* — Mark R Gaworecki
(74) *Attorney, Agent, or Firm* — Spano Law Group; Joseph S. Spano

(57) ABSTRACT

Methods and systems for measuring the orientation of a wafer at or near an X-ray scatterometry measurement location are described herein. In one aspect, an X-ray scatterometry based metrology system includes a wafer orientation measurement system that measures wafer orientation based on a single measurement without intervening stage moves. In some embodiments, an orientation measurement spot is coincident with an X-ray measurement spot. In some embodiments, an X-ray scatterometry measurement and a wafer orientation measurement are performed simultaneously. In another aspect, signals detected by a wafer orientation measurement system are filtered temporally, spatially, or both, to improve tracking. In another aspect, a wafer orientation measurement system is calibrated to identify the orientation of the wafer with respect to an incident X-ray beam. In another aspect, a wafer under measurement is positioned based on the measured orientation in a closed loop or open loop manner.

24 Claims, 8 Drawing Sheets

(51) Int. Cl.
*G03F 7/20* (2006.01)
*G01N 21/956* (2006.01)

(52) U.S. Cl.
CPC ........ *G01B 2210/56* (2013.01); *G01N 21/956* (2013.01); *G01N 2223/6116* (2013.01)

(56) References Cited

U.S. PATENT DOCUMENTS

| | | | |
|---|---|---|---|
| 6,023,338 | A | 2/2000 | Bareket |
| 6,197,117 | B1 | 3/2001 | Li |
| 6,429,943 | B1 | 8/2002 | Opsal et al. |
| 6,716,646 | B1 | 4/2004 | Wright et al. |
| 6,778,275 | B2 | 8/2004 | Bowes |
| 6,787,773 | B1 | 9/2004 | Lee |
| 6,992,764 | B1 | 1/2006 | Yang et al. |
| 7,242,477 | B2 | 7/2007 | Mieher et al. |
| 7,321,426 | B1 | 1/2008 | Poslavsky et al. |
| 7,406,153 | B2 | 7/2008 | Berman |
| 7,478,019 | B2 | 1/2009 | Zangooie et al. |
| 7,626,702 | B2 | 12/2009 | Ausschnitt et al. |
| 7,656,528 | B2 | 2/2010 | Abdulhalim et al. |
| 7,826,071 | B2 | 11/2010 | Shchegrov et al. |
| 7,842,933 | B2 | 11/2010 | Shur et al. |
| 7,873,585 | B2 | 1/2011 | Izikson |
| 7,929,667 | B1 | 4/2011 | Zhuang et al. |
| 7,933,026 | B2 | 4/2011 | Opsal et al. |
| 8,068,662 | B2 | 11/2011 | Zhang et al. |
| 8,138,498 | B2 | 3/2012 | Ghinovker |
| 9,826,614 | B1 | 11/2017 | Bakeman et al. |
| 10,152,678 | B2 | 12/2018 | Pandev et al. |
| 2003/0021465 | A1 | 1/2003 | Adel et al. |
| 2007/0176128 | A1 | 8/2007 | Van Bilsen et al. |
| 2007/0221842 | A1 | 9/2007 | Morokuma et al. |
| 2009/0152463 | A1 | 6/2009 | Toyoda et al. |
| 2010/0002402 | A1 | 1/2010 | Rogers et al. |
| 2011/0266440 | A1 | 11/2011 | Boughorbel et al. |
| 2012/0292502 | A1 | 11/2012 | Langer et al. |
| 2013/0208279 | A1 | 8/2013 | Smith |
| 2013/0304424 | A1 | 11/2013 | Bakeman et al. |
| 2014/0019097 | A1 | 1/2014 | Bakeman et al. |
| 2014/0064445 | A1 | 3/2014 | Adler |
| 2014/0111791 | A1 | 4/2014 | Manassen et al. |
| 2014/0172394 | A1 | 6/2014 | Kuznetsov et al. |
| 2014/0222380 | A1 | 8/2014 | Kuznetsov et al. |
| 2014/0297211 | A1 | 10/2014 | Pandev et al. |
| 2015/0110249 | A1 | 4/2015 | Bakeman et al. |
| 2015/0117610 | A1 | 4/2015 | Veldman et al. |
| 2015/0204664 | A1 | 7/2015 | Bringoltz et al. |
| 2015/0285749 | A1 | 10/2015 | Moncton et al. |
| 2015/0300965 | A1 | 10/2015 | Sezginer et al. |
| 2016/0202193 | A1 | 7/2016 | Hench et al. |
| 2016/0320319 | A1 | 11/2016 | Hench et al. |
| 2017/0167862 | A1 | 6/2017 | Dziura et al. |
| 2018/0106735 | A1 | 4/2018 | Gellineau et al. |
| 2018/0113084 | A1 | 4/2018 | Hench et al. |
| 2018/0328868 | A1 | 11/2018 | Bykanov et al. |
| 2019/0293578 | A1 | 9/2019 | Gellineau |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).
Thiel, Brad et al., "Advances in CD-Metrology (CD-SAXS, Mueller Matrix Based Scatterometry, and SEM," Conference Presentation, 2011.
Settens, Charles M., "An Assessment of Critical Dimension Small Angle X-Ray Scattering Metrology for Advanced Semiconductor Manufacturing," Doctoral Dissertation, University at Albany, State University of New York, 2015.
International Search Report dated May 24, 2021, for PCT Application No. PCT/US2021/018304. Filed on Feb. 17, 2021 by KLA Corporation, 4 pages.

MEASUREMENT AND CONTROL OF WAFER TILT FOR X-RAY BASED METROLOGY

CROSS REFERENCE TO RELATED APPLICATION

The present application for patent claims priority under 35 U.S.C. § 119 from U.S. provisional patent application Ser. No. 62/979,274, filed Feb. 20, 2020, the subject matter of which is incorporated herein by reference in its entirety.

TECHNICAL FIELD

The described embodiments relate to x-ray metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

Traditionally, scatterometry critical dimension measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. Optical metrology tools utilizing infrared to visible light can penetrate many layers of translucent materials, but longer wavelengths that provide good depth of penetration do not provide sufficient sensitivity to small anomalies. In addition, the increasing number of parameters required to characterize complex structures (e.g., FinFETs), leads to increasing parameter correlation. As a result, the parameters characterizing the target often cannot be reliably decoupled with available measurements.

In one example, longer wavelengths (e.g. near infrared) have been employed in an attempt to overcome penetration issues for 3D FLASH devices that utilize polysilicon as one of the alternating materials in the stack. However, the mirror like structure of 3D FLASH intrinsically causes decreasing light intensity as the illumination propagates deeper into the film stack. This causes sensitivity loss and correlation issues at depth. In this scenario, SCD is only able to successfully extract a reduced set of metrology dimensions with high sensitivity and low correlation.

In another example, opaque, high-k materials are increasingly employed in modern semiconductor structures. Optical radiation is often unable to penetrate layers constructed of these materials. As a result, measurements with thin-film scatterometry tools such as ellipsometers or reflectometers are becoming increasingly challenging.

In response to these challenges, more complex optical metrology tools have been developed. For example, tools with multiple angles of illumination, shorter illumination wavelengths, broader ranges of illumination wavelengths, and more complete information acquisition from reflected signals (e.g., measuring multiple Mueller matrix elements in addition to the more conventional reflectivity or ellipsometric signals) have been developed. However, these approaches have not reliably overcome fundamental challenges associated with measurement of many advanced targets (e.g., complex 3D structures, structures smaller than 10 nm, structures employing opaque materials) and measurement applications (e.g., line edge roughness and line width roughness measurements).

Atomic force microscopes (AFM) and scanning-tunneling microscopes (STM) are able to achieve atomic resolution, but they can only probe the surface of the specimen. In addition, AFM and STM microscopes require long scanning times. Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance.

To overcome penetration depth issues, traditional imaging techniques such as TEM, SEM etc., are employed with destructive sample preparation techniques such as focused ion beam (FIB) machining, ion milling, blanket or selective etching, etc. For example, transmission electron microscopes (TEM) achieve high resolution levels and are able to probe arbitrary depths, but TEM requires destructive sectioning of the specimen. Several iterations of material removal and measurement generally provide the information required to measure the critical metrology parameters throughout a three dimensional structure. But, these techniques require sample destruction and lengthy process times. The complexity and time to complete these types of measurements introduces large inaccuracies due to drift of etching and metrology steps. In addition, these techniques require numerous iterations which introduce registration errors.

Small-Angle X-Ray Scatterometry (SAXS) systems have shown promise to address challenging measurement applications. Various aspects of the application of SAXS technology to the measurement of critical dimensions (CD-SAXS) and overlay (OVL-SAXS) are described in 1) U.S. Pat. No. 7,929,667 to Zhuang and Fielden, entitled "High-brightness X-ray metrology," 2) U.S. Patent Publication No. 2014/0019097 by Bakeman, Shchegrov, Zhao, and Tan, entitled "Model Building And Analysis Engine For Combined X-Ray And Optical Metrology," 3) U.S. Patent Publication No. 2015/0117610 by Veldman, Bakeman, Shchegrov, and Mieher, entitled "Methods and Apparatus For Measuring Semiconductor Device Overlay Using X-Ray Metrology," 4) U.S. Patent Publication No. 2016/0202193 by Hench, Shchegrov, and Bakeman, entitled "Measurement System Optimization For X-Ray Based Metrology," 5) U.S. Patent Publication No. 2017/0167862 by Dziura, Gellineau, and Shchegrov, entitled "X-ray Metrology For High Aspect Ratio Structures," and 6) U.S. Patent Publication No. 2018/0106735 by Gellineau, Dziura, Hench, Veldman, and Zalubovsky, entitled "Full Beam Metrology for X-Ray Scatterometry Systems." The aforementioned patent documents are assigned to KLA-Tencor Corporation, Milpitas, Calif. (USA).

SAXS has also been applied to the characterization of materials and other non-semiconductor related applications. Exemplary systems have been commercialized by several companies, including Xenocs SAS (www.xenocs.com), Bruker Corporation (www.bruker.com), and Rigaku Corporation (www.rigaku.com/en).

Research on CD-SAXS metrology of semiconductor structures is also described in scientific literature. Most research groups have employed high-brightness X-ray synchrotron sources which are not suitable for use in a semiconductor fabrication facility due to their immense size, cost, etc. One example of such a system is described in the article entitled "Intercomparison between optical and x-ray scatterometry measurements of FinFET structures" by Lemaillet, Germer, Kline et al., Proc. SPIE, v. 8681, p. 86810Q (2013). More recently, a group at the National Institute of Standards and Technology (NIST) has initiated research employing compact and bright X-ray sources similar those described in U.S. Pat. No. 7,929,667. This research is described in an article entitled "X-ray scattering critical dimensional metrology using a compact x-ray source for next generation semiconductor devices," J. Micro/Nanolith. MEMS MOEMS 16(1), 014001 (January-March 2017).

In general, the interaction of the X-ray beam with the target must be calibrated and aligned with the metrology system to ensure effective measurements. Exemplary characterizations include precisely locating the peak intensity of the X-ray beam on the target, measuring the X-Ray beam intensity distribution, identifying the boundaries of the X-ray beam such that only a certain percentage of beam flux lies outside of the boundaries, precisely estimating wafer tilt, etc. Exemplary alignments include alignment of the X-ray beam with an optical vision system, alignment of the X-ray beam with specific mechanical features of the tool (e.g., axes of wafer rotation, etc.), angular alignment of wafer with respect to the incident X-ray beam, etc.

Wafer tilt at the point of measurement significantly affects X-ray scatterometry measurements. Unacceptable X-ray scatterometry measurement errors occur without precise knowledge of the orientation of the wafer with respect to the incident X-ray beam at the location of incidence of the X-ray illumination beam on the wafer.

Unfortunately, semiconductor wafers under measurement are usually not flat. A semiconductor wafer often includes different materials disposed at different thicknesses across its surface. This lack of homogeneity results in different mechanical stiffness across the wafer surface and a non-uniform curvature across the wafer surface. As a result, an unconstrained wafer having a three hundred millimeter diameter often has a bow or complex shape. In some examples, the surface of a wafer varies from an ideal plane by more than one millimeter, and the orientation of the surface of a wafer may vary by +/− two degrees depending on location on the wafer surface.

Wafer tilt may be partially reduced by using a wafer chuck employing vacuum or electrostatic actuators to force the backside surface of the wafer into contact with a mechanically flat wafer chuck. Although, this constraint significantly reduces wafer tilt across the entire surface of the wafer (i.e., global wafer flatness), it does little to address flatness of the wafer over relatively small areas where the X-ray illumination beam in incident on the wafer (i.e., local wafer flatness).

Furthermore, the use of a wafer chuck that supports the wafer across the backside surface of the wafer is only suitable for a reflective X-ray scatterometry system. A transmission SAXS system requires the use of an edge-grip wafer chuck to allow scattered X-rays to propagate without distortion to the detector. With limited ability to constrain the wafer, a transmission SAXS system must measure the wafer in a relatively unconstrained state.

Typically, wafer tilt is estimated using a distance sensor. The distance sensor measures the distance between the wafer surface and reference frame. The wafer is moved into at least three different locations relative to the distance sensor and the distance is measured at each of these locations. Interpolation is employed to estimate a best fit plane that estimates the orientation of the wafer surface based on the measured distance measurements at the different locations on the wafer.

This approach has several disadvantages. First, sampling the distance at multiple, different locations is time consuming. Each measurement requires a stage movement that reduces tool throughput. Furthermore, the sequence of stage movements required to estimate wafer tilt precludes simultaneous X-ray measurement of the wafer at a particular location. Second, the accuracy and precision of the estimation provided by the best fit plane is compromised by a number of practical factors. A semiconductor wafer under measurement usually includes different structures disposed on the wafer surface. These structures may be higher or lower than an ideal plane (e.g., average wafer surface plane). The variation in height of the wafer due to the presence of structures having different heights introduces errors into the estimation of the orientation of the best fit plane. To reduce the impact of this error source, more locations on the wafer surface may be measured and the distances from all of these points may be used to estimate the orientation of the best fit plane. By measuring enough points, the impact of height variation from different structures is effectively minimized by averaging. However, performing distance measurements at a larger number of locations dramatically and unacceptably reduces tool throughput. Finally, the actual shape of a semiconductor wafer near an X-ray measurement point is often a complex shape that is not accurately estimated by a best fit plane. As a result, the estimation of wafer tilt at a particular location using a best fit plane may result in an inaccurate angle measurement that results in X-ray scatterometry measurements with unacceptable errors.

Future metrology applications present challenges due to increasingly small resolution requirements, multi-parameter correlation, increasingly complex geometric structures including high aspect ratio structures, and increasing use of opaque materials. Existing methods of estimating wafer orientation at a point of X-ray scatterometry measurement are time consuming and limited in accuracy. Thus, methods and systems for improved measurement of wafer tilt in X-Ray scatterometry systems are desired to meet the requirements of advanced manufacturing nodes.

SUMMARY

Methods and systems for measuring the orientation of a wafer at or near an X-ray scatterometry measurement location are described herein.

In one aspect, an X-ray scatterometry based metrology system, such as a transmission, small angle x-ray scatterometry (T-SAXS) metrology tool 100 or a reflective, small angle x-ray scatterometry (R-SAXS) metrology tool, includes a wafer orientation measurement system. The wafer orientation measurement system generates a measurement of wafer orientation at a measurement location based on a single measurement without intervening stage moves. By measuring wafer orientation at one point, the measurement is unaffected by wafer bow.

In some embodiments, an orientation measurement spot is coincident with an X-ray measurement spot. In some other embodiments, an orientation measurement spot is not coincident with an X-ray measurement spot. However, if a wafer orientation measurement spot is spatially separated from an X-ray measurement spot, it must be reasonably close to avoid excessive error. In one example, a wafer orientation measurement spot spatially separated from an X-ray measurement spot should be located within 500 micrometers of the X-ray measurement spot. In another example, a wafer orientation measurement spot spatially separated from an X-ray measurement spot should be located within 100 micrometers of the X-ray measurement spot.

In some embodiments, an X-ray scatterometry measurement and a wafer orientation measurement are performed simultaneously.

In a further aspect, signals detected by a wafer orientation measurement system are filtered to improve tracking of the actual orientation of the wafer surface at the measurement location. In some embodiments, the detected signals are averaged over time to filter out effects of backside wafer imperfections and signal deviations. In some other embodiments, the detected signals are spatially filtered based on the expected shape of the spot on the detector.

In some embodiments, the detected signals are collected over time and transformed to the frequency domain. The amplitudes of the frequency components are indicative of the position stability of the wafer under measurement and the frequency components themselves are indicative of the modal characteristics of the wafer under measurement. In this manner, the wafer orientation measurement system is employed to monitor wafer modal dynamics and position stability during measurement.

In a further aspect, a wafer orientation measurement system is calibrated to identify the orientation of the wafer with respect to an incident X-ray beam.

In some embodiments, a distance sensor measuring a distance to the front side of a wafer under measurement at many measurement sites is employed to estimate the orientation of the wafer at the orientation measurement spot. The orientation estimated by the distance sensor is treated as the measured orientation of the wafer orientation measurement system at the orientation measurement spot.

In some other embodiments, the X-ray metrology system itself is employed to estimate the orientation of the wafer at the orientation measurement spot. The wafer is rotated through a sequence of orientations around the presumed orientation of normal incidence. The measured diffraction patterns are analyzed to find the orientation about which the diffraction patterns are symmetric. This orientation is treated as the zero angle, i.e., the orientation angle of the wafer that is normal to the incident X-ray illumination beam. The zero angle is treated as the measured zero angle by the wafer orientation measurement system at the orientation measurement spot.

In general, the calibration of the wafer orientation measurement system may be performed at each measurement site, or at one or more measurement sites on the wafer surface.

In another further aspect, a wafer positioning system of an X-ray based metrology system positions a wafer under measurement based on measurements provided by a wafer orientation measurement system as described herein.

In some embodiments, a wafer positioning system is controlled in a closed loop manner based on the wafer orientation measurement provided by the wafer orientation measurement system. In some embodiments, a wafer positioning system is controlled in an open loop manner based on the wafer orientation measurement provided by the wafer orientation measurement system. In one example, a map of the orientation of a wafer at a number of different measurement sites on the wafer is generated based on orientation measurements performed by the wafer orientation measurement system at each different measurement site. The map is employed to correct the orientation setpoint employed for each X-ray scatterometry measurement performed at each measurement site.

In some embodiments, the wafer orientation measurement system is mounted to a reference frame to which the X-ray illumination source is mounted. In these embodiments, the wafer orientation measurement system measures orientation with respect to the incidence X-ray beam directly.

In some other embodiments, the wafer orientation measurement system is mounted to a stage reference frame that moves with respect to the X-ray illumination source. In these embodiments, the wafer orientation measurement system measures orientation with respect to the incidence X-ray beam indirectly.

A wafer orientation measurement system as described herein may be implemented as part of a transmission X-ray metrology system, a reflective X-ray metrology system, or an X-ray scatterometry based metrology system operable in both reflective and transmissive modes.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for rapidly and accurately measuring the orientation of a wafer at or near an X-ray scatterometry measurement location are described herein. In some embodiments, an orientation measurement and an X-ray scatterometry measurement at a particular location on a wafer surface are performed simultaneously. By way of non-limiting example, the orientation measurement systems and techniques described herein are employed as part of a Transmission, Small-Angle X-ray Scatterometry (T-SAXS) metrology system or a Reflective, Small-Angle X-ray Scatterometry (R-SAXS) metrology system.

Practical X-ray scatterometry measurements in a semiconductor manufacturing environment require measurements over a large range of angles of incidence and azimuth with respect to the surface of a specimen (e.g., semiconductor wafer) with a small beam spot size (e.g., 50-700 micrometers across the effective illumination spot). Precise measurement of the orientation of the wafer at the point of measurement is required to achieve accurate X-ray measurement results. In addition, calibrations that accurately relate the measured orientation of the wafer to the actual orientation of wafer with respect to the incidence X-ray beam are required to accurately determine wafer orientation with respect to the incident X-ray beam over the full range of incidence and azimuth angles.

Figure 1:
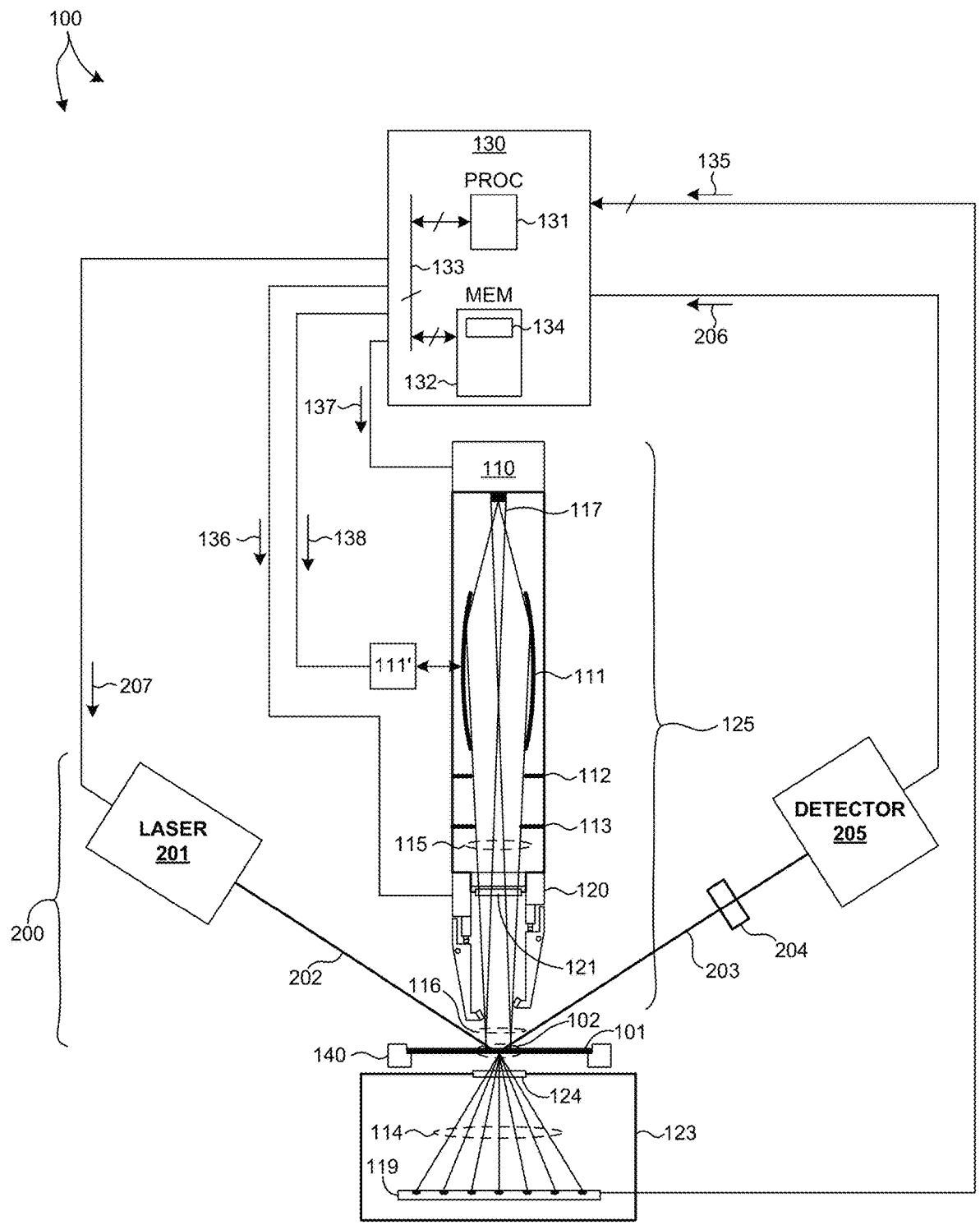
FIG. 1 is a diagram illustrative of transmission, small angle x-ray scatterometry (T-SAXS) metrology tool 100 including a wafer orientation measurement system 200 in at least one novel aspect.

FIG. 1 illustrates an embodiment of a T-SAXS metrology tool 100 for measuring characteristics of a specimen including a wafer orientation measurement system 200 in at least one novel aspect. As shown in FIG. 1, the system 100 may be used to perform T-SAXS measurements over X-ray measurement spot 102 of a specimen 101 illuminated by an illumination beam.

In the depicted embodiment, metrology tool 100 includes an x-ray illumination subsystem 125 including an x-ray illumination source 110, focusing optics 111, beam divergence control slit 112, intermediate slit 113, and beam shaping slit mechanism 120. The x-ray illumination source 110 is configured to generate x-ray radiation suitable for T-SAXS measurements. In some embodiments, the x-ray illumination source 110 is configured to generate wavelengths between 0.01 nanometers and 1 nanometer. In general, any suitable high-brightness x-ray illumination source capable of generating high brightness x-rays at flux levels sufficient to enable high-throughput, inline metrology may be contemplated to supply x-ray illumination for T-SAXS measurements. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV are employed to ensure that the x-ray source supplies light at wavelengths that allow sufficient transmission through the entire device as well as the wafer substrate. By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 110. In one example, an inverse Compton source available from Lyncean Technologies, Inc., Palo Alto, Calif. (USA) may be contemplated. Inverse Compton sources have an additional advantage of being able to produce x-rays over a range of photon energies, thereby enabling the x-ray source to deliver x-ray radiation at different, selectable wavelengths.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

X-ray illumination source 110 produces x-ray emission over a source area having finite lateral dimensions (i.e., non-zero dimensions orthogonal to the beam axis. Focusing optics 111 focuses source radiation onto a metrology target located on specimen 101. The finite lateral source dimension results in finite spot size on the target defined by the rays 117 coming from the edges of the source. In some embodiments, focusing optics 111 includes elliptically shaped focusing optical elements.

A beam divergence control slit 112 is located in the beam path between focusing optics 111 and beam shaping slit mechanism 120. Beam divergence control slit 112 limits the divergence of the illumination provided to the specimen under measurement. An additional intermediate slit 113 is located in the beam path between beam divergence control slit 112 and beam shaping slit mechanism 120. Intermediate slit 113 provides additional beam shaping. In general, however, intermediate slit 113 is optional.

Beam shaping slit mechanism 120 is located in the beam path immediately before specimen 101. In one aspect, the slits of beam shaping slit mechanism 120 are located in close proximity to specimen 101 to minimize the enlargement of the incident beam spot size due to beam divergence defined by finite source size. In one example, expansion of the beam spot size due to shadow created by finite source size is approximately one micrometer for a 10 micrometer x-ray source size and a distance of 25 millimeters between the beam shaping slits and specimen 101.

In some embodiments, beam shaping slit mechanism 120 includes multiple, independently actuated beam shaping slits. In one embodiment, beam shaping slit mechanism 120 includes four independently actuated beam shaping slits. These four beams shaping slits effectively block a portion of incoming beam 115 and generate an illumination beam 116 having a box shaped illumination cross-section.

Figure 2:
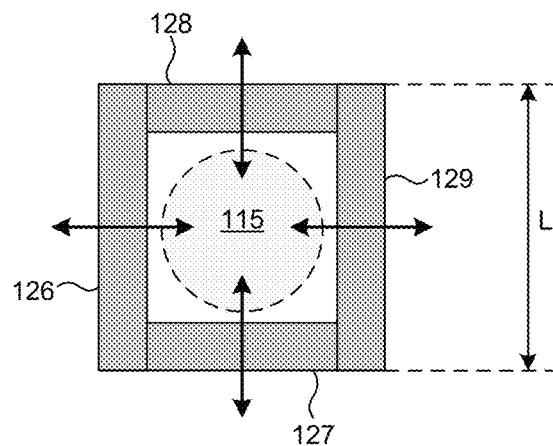
FIG. 2 depicts an end view of a beam shaping slit mechanism in one configuration.
Figure 3:
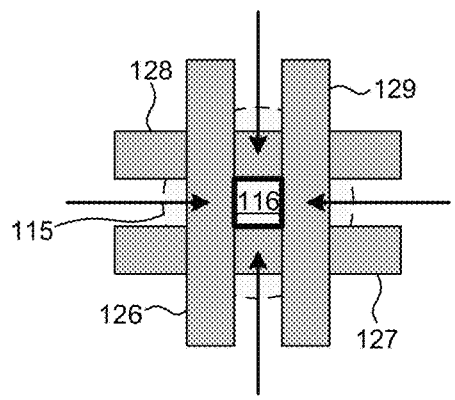
FIG. 3 depicts an end view of a beam shaping slit mechanism in another configuration.

FIGS. 2 and 3 depict an end view of beam shaping slit mechanism 120 depicted in FIG. 1 in two different configurations. As illustrated in FIGS. 2 and 3, the beam axis is perpendicular to the drawing page. As depicted in FIG. 2, incoming beam 115 has a large cross-section. In some embodiments, incoming beam 115 has a diameter of approximately one millimeter. Furthermore, the location of incoming beam 115 within beam shaping slits 126-129 may have an uncertainty of approximately three millimeters due to beam pointing errors. To accommodate the size of the incoming beam and the uncertainty of the beam location, each slit has a length, L, of approximately six millimeters. As depicted in FIG. 2, each slit is moveable in a direction perpendicular to the beam axis. In the illustration of FIG. 2, slits 126-129 are located at a maximum distance from the beam axis (i.e., the slits are fully open and they are not restricting the light passing through beam shaping slit mechanism 120.

FIG. 3 depicts slits 126-129 of beam shaping slit mechanism 120 in positions that block a portion of incoming beam 115, such that outgoing beam 116 delivered to the specimen under measurement has reduced size and well-defined shape. As depicted in FIG. 3, each of slits 126-129 has moved inward, toward the beam axis to achieve the desired output beam shape.

Slits 126-129 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit. In some embodiments, each slit has a rectangular cross-section having a width is approximately 0.5 millimeters and a height of approximately 1-2 millimeters. As depicted in FIG. 2, the length, L, of a slit is approximately 6 millimeters.

In general, x-ray optics shape and direct x-ray radiation to specimen 101. In some examples, the x-ray optics include an x-ray monochromator to monochromatize the x-ray beam that is incident on the specimen 101. In some examples, the x-ray optics collimate or focus the x-ray beam onto X-ray measurement area 102 of specimen 101 to less than 1 milliradian divergence using multilayer x-ray optics. In these examples, the multilayer x-ray optics function as a beam monochromator, also. In some embodiments, the x-ray optics include one or more x-ray collimating mirrors, x-ray apertures, x-ray beam stops, refractive x-ray optics, diffractive optics such as zone plates, Montel optics, specular x-ray optics such as grazing incidence ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

X-ray detector 119 collects x-ray radiation 114 scattered from specimen 101 and generates an output signals 135 indicative of properties of specimen 101 that are sensitive to the incident x-ray radiation in accordance with a T-SAXS measurement modality. In some embodiments, scattered x-rays 114 are collected by x-ray detector 119 while specimen positioning system 140 locates and orients specimen 101 to produce angularly resolved scattered x-rays.

In some embodiments, a T-SAXS system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 119 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 135 for further processing and storage.

In a further aspect, a T-SAXS system is employed to determine properties of a specimen (e.g., structural parameter values) based on one or more diffraction orders of scattered light. As depicted in FIG. 1, metrology tool 100 includes a computing system 130 employed to acquire signals 135 generated by detector 119 and determine properties of the specimen based at least in part on the acquired signals.

In some examples, metrology based on T-SAXS involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

It is desirable to perform measurements at large ranges of angle of incidence and azimuth angle to increase the precision and accuracy of measured parameter values. This approach reduces correlations among parameters by extending the number and diversity of data sets available for analysis to include a variety of large-angle, out of plane orientations. For example, in a normal orientation, T-SAXS is able to resolve the critical dimension of a feature, but is largely insensitive to sidewall angle and height of a feature. However, by collecting measurement data over a broad range of out of plane angular orientations, the sidewall angle and height of a feature can be resolved. In other examples, measurements performed at large ranges of angle of incidence and azimuth angle provide sufficient resolution and depth of penetration to characterize high aspect ratio structures through their entire depth.

Measurements of the intensity of diffracted radiation as a function of x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

Figure 4:
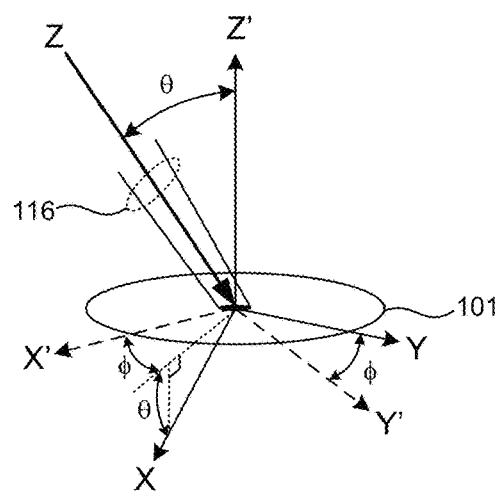
FIG. 4 depicts an x-ray illumination beam incident on a wafer at a particular orientation described by angles $\phi$ and $\theta$.

Each orientation of the illuminating x-ray beam 116 relative to the surface normal of a semiconductor wafer 101 is described by any two angular rotations of wafer 101 with respect to the x-ray illumination beam 115, or vice-versa. In one example, the orientation can be described with respect to a coordinate system fixed to the wafer. FIG. 4 depicts x-ray illumination beam 116 incident on wafer 101 at a particular orientation described by an angle of incidence, $\theta$, and an azimuth angle, $\phi$. Coordinate frame XYZ is fixed to the metrology system (e.g., illumination beam 116) and coordinate frame X'Y'Z' is fixed to wafer 101. The Y axis is aligned in plane with the surface of wafer 101. X and Z are not aligned with the surface of wafer 101. Z' is aligned with an axis normal to the surface of wafer 101, and X' and Y' are in a plane aligned with the surface of wafer 101. As depicted in FIG. 4, x-ray illumination beam 116 is aligned with the Z-axis and thus lies within the XZ plane. Angle of incidence, $\theta$, describes the orientation of the x-ray illumination beam 116 with respect to the surface normal of the wafer in the XZ plane. Furthermore, azimuth angle, $\phi$, describes the orientation of the XZ plane with respect to the X'Z' plane. Together, $\theta$ and $\phi$, uniquely define the orientation of the x-ray illumination beam 116 with respect to the surface of wafer 101. In this example, the orientation of the x-ray illumination beam with respect to the surface of wafer 101 is described by a rotation about an axis normal to the surface of wafer 101 (i.e., Z' axis) and a rotation about an axis aligned with the surface of wafer 101 (i.e., Y axis). In some other examples, the orientation of the x-ray illumination beam with respect to the surface of wafer 101 is described by a rotation about a first axis aligned with the surface of wafer 101 and another axis aligned with the surface of wafer 101 and perpendicular to the first axis.

In one aspect, metrology tool 100 includes a specimen positioning system 140 configured to actively position specimen 101 in six degrees of freedom with respect to illumination beam 116. In addition, specimen positioning system 101 is configured to align specimen 101 and orient specimen 101 over a large range of angles of incidence (e.g., at least 70 degrees) and azimuth angle (e.g., at least 190 degrees) with respect the illumination beam 116. In some embodiments, specimen positioning system 140 is configured to rotate specimen 101 over a large range of angles of rotation (e.g., at least 70 degrees) aligned in-plane with the surface of specimen 101. In this manner, angle resolved measurements of specimen 101 are collected by metrology system 100 over any number of locations and orientations on the surface of specimen 101. In one example, computing system 130 communicates command signals (not shown) to specimen positioning system 140 that indicate the desired position of specimen 101. In response, specimen positioning system 140 generates command signals to the various actuators of specimen positioning system 140 to achieve the desired positioning of specimen 101.

Figure 5:
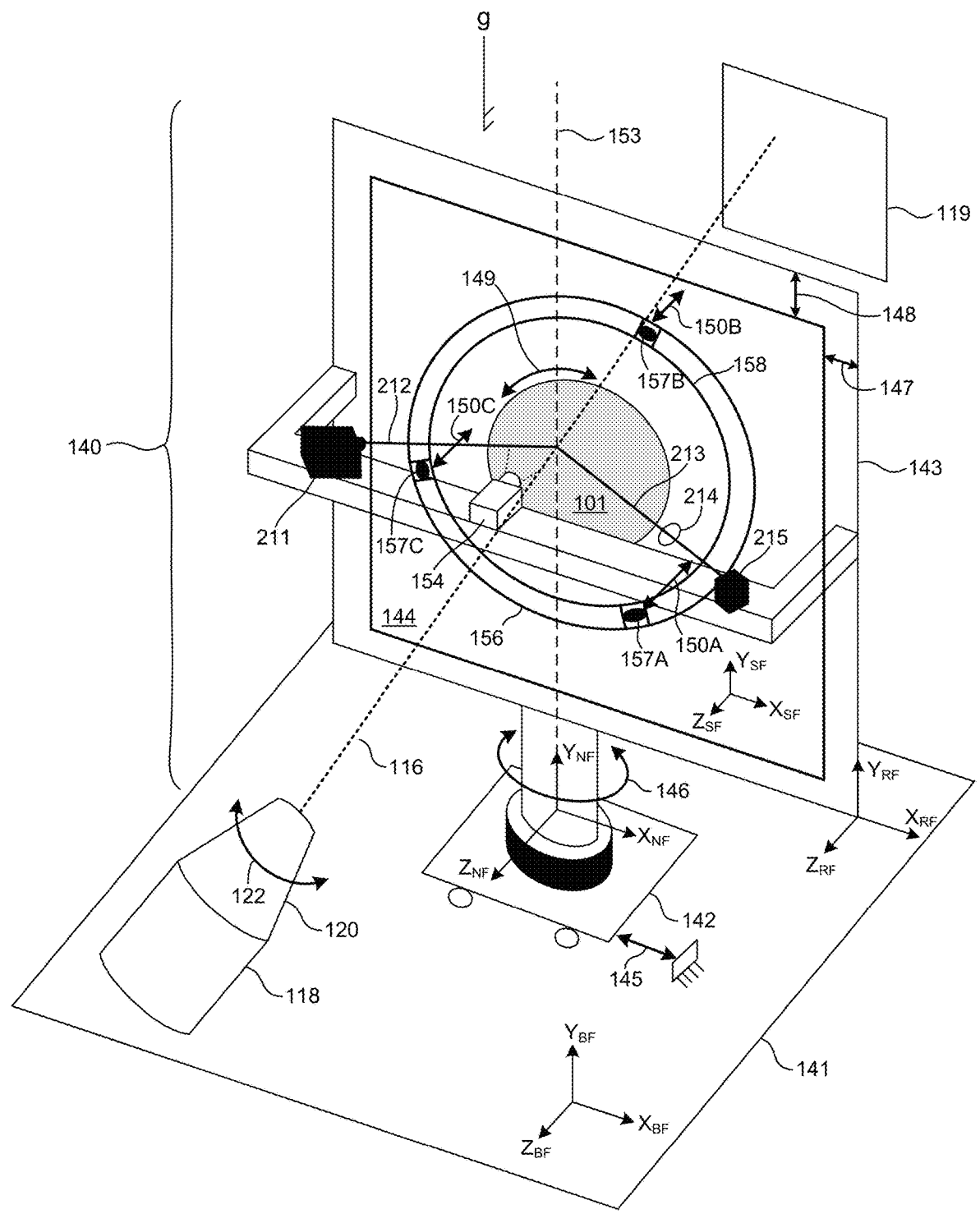
FIG. 5 is a diagram illustrative of a specimen positioning system with the wafer stage moved to a position where an x-ray illumination beam is incident on a wafer.

FIG. 5 depicts a specimen positioning system 140 in one embodiment. In one aspect, specimen positioning system 140 provides active control of the position of wafer 101 with respect to illumination beam 116 in all six degrees of freedom while supporting wafer 101 vertically with respect to the gravity vector (i.e., the gravity vector is approximately in-plane with the wafer surface). Specimen positioning system 140 supports wafer 101 at the edges of wafer 101 allowing illumination beam 116 to transmit through wafer 101 over any portion of the active area of wafer 101 without remounting wafer 101. By supporting wafer 101 vertically at its edges, gravity induced sag of wafer 101 is effectively mitigated.

As depicted in FIG. 5, specimen positioning system 140 includes a base frame 141, a lateral alignment stage 142, a stage reference frame 143, and a wafer stage 144 mounted to stage reference frame 143. For reference purposes, the $\{X_{BF}, Y_{BF}, Z_{BF}\}$ coordinate frame is attached to base frame 141, the $\{X_{NF}, Y_{NF}, Z_{NF}\}$ coordinate frame is attached to lateral alignment stage 142, the $\{X_{RF}, Y_{RF}, Z_{RF}\}$ coordinate frame is attached to stage reference frame 143, and the $\{X_{SF}, Y_{SF}, Z_{SF}\}$ coordinate frame is attached to wafer stage 144. Wafer 101 is supported on wafer stage 144 by a tip-tilt-Z stage 156 including actuators 150A-C. A rotary stage 158 mounted to tip-tilt-Z stage 156 orients wafer 101 over a range of azimuth angles, $\phi$, with respect to illumination beam 116. In the depicted embodiment, three linear actuators 150A-C are mounted to the wafer stage 144 and support rotary stage 158, which, in turn, supports wafer 101.

Actuator 145 translates the lateral alignment stage 142 with respect to the base frame 141 along the $X_{BF}$ axis. Rotary actuator 146 rotates the stage reference frame 143 with respect to lateral alignment stage 142 about an axis of rotation 153 aligned with the $Y_{NF}$ axis. Rotary actuator 146 orients wafer 101 over a range of angles of incidence, $\theta$, with respect to illumination beam 116. Wafer stage actuators 147 and 148 translate the wafer stage 144 with respect to the stage reference frame 143 along the $X_{RF}$ and $Y_{RF}$ axes, respectively.

In one aspect, wafer stage 144 is an open aperture, two-axis (XY) linear stacked stage. The open aperture allows the measurement beam to transmit through any portion of the entire wafer (e.g., 300 millimeter wafer). The wafer stage 144 is arranged such that the Y-axis stage extends in a direction approximately parallel to the axis of rotation 153. Furthermore, the Y-axis stage extends in a direction that is approximately aligned with the gravity vector.

Actuators 150A-C operate in coordination to translate the rotary stage 158 and wafer 101 with respect to the wafer stage 144 in the $Z_{SF}$ direction and tip and tilt rotary stage 158 and wafer 101 with respect to the wafer stage 144 about axes coplanar with the $X_{SF}$-$Y_{SF}$ plane. Actuators 149 of rotary stage 158 rotate wafer 101 about an axis normal to the surface of wafer 101. In a further aspect, a frame of rotary stage 158 is coupled to actuators 150A-C by a kinematic mounting system including kinematic mounting elements 157A-C, respectively. In one example, each kinematic mounting element 157A-C includes a sphere attached to a corresponding actuator and a V-shaped slot attached to rotary stage 158. Each sphere makes a two point contact with a corresponding V-shaped slot. Each kinematic mounting element constrains the motion of rotary stage 158 with respect to actuators 150A-C in two degrees of freedom and collectively, the three kinematic mounting elements 157A-C constrain the motion of rotary stage 158 with respect to actuators 150A-C in six degrees of freedom. Each kinematic coupling element is preloaded to ensure that the sphere remains in contact with the corresponding V-shaped slot at all times. In some embodiments, the preload is provided by gravity, a mechanical spring mechanism, or a combination thereof.

In another further aspect, rotary stage 158 is an open aperture, rotary stage. The open aperture allows the measurement beam to transmit through any portion of the entire wafer (e.g., 300 millimeter wafer). The rotary stage 158 is arranged such that its axis of rotation is approximately perpendicular to the axis of rotation 153. Furthermore, the axis of rotation of the rotary stage 158 is approximately perpendicular to the gravity vector. The wafer 101 is secured to the rotary stage 158 via edge grippers to provide full wafer coverage with minimal edge exclusion.

In summary, specimen positioning system 140 is capable of actively controlling the position of wafer 101 in six degrees of freedom with respect to the illumination beam 116 such that illumination beam 116 may be incident at any location on the surface of wafer 101 (i.e., at least 300 millimeter range in $X_{RF}$ and $Y_{RF}$ directions). Rotary actuator 146 is capable of rotating the stage reference frame 143 with respect to the illumination beam 116 such that illumination beam 116 may be incident at the surface of wafer 101 at any of a large range of angles of incidence (e.g., greater than two degrees). In one embodiment, rotary actuator 146 is configured to rotate stage reference frame 143 over a range of at least sixty degrees. Rotary actuator 158 mounted to wafer stage 144 is capable of rotating the wafer 101 with respect to the illumination beam 116 such that illumination beam 116 may be incident at the surface of wafer 101 at any of a large range of azimuth angles (e.g., at least ninety degrees rotational range). In some embodiments, the range of azimuth angles is at least one hundred ninety degrees rotational range.

In some other embodiments, lateral alignment stage 142 is removed and stage reference frame 143 is rotated with respect to base frame 141 by rotary actuator 146. In these embodiments, the x-ray illumination system includes one or more actuators that move one or more optical elements of the x-ray illumination system that cause the x-ray illumination beam 116 to move with respect to the base frame 141, for example, in the $X_{BF}$ direction. In these embodiments, movements of stage reference stage 143 for purposes of calibration as described herein are replaced by movements of one or more optical elements of the x-ray illumination system move the x-ray illumination beam to the desired position with respect to the axis of rotation 153, for example. In the embodiment depicted in FIG. 1, computing system 130 communicates command signals 138 to actuator subsystem 111' to redirect the x-ray emission relative to base frame 141 to achieve a desired beam direction by moving one or more elements of x-ray illumination subsystem 125. In the depicted embodiment, actuator subsystem 111' moves focusing optics 111 to redirect the x-ray emission relative to base frame 141, and thus relocate the x-ray emission relative to the axis of rotation 153.

Figure 11:
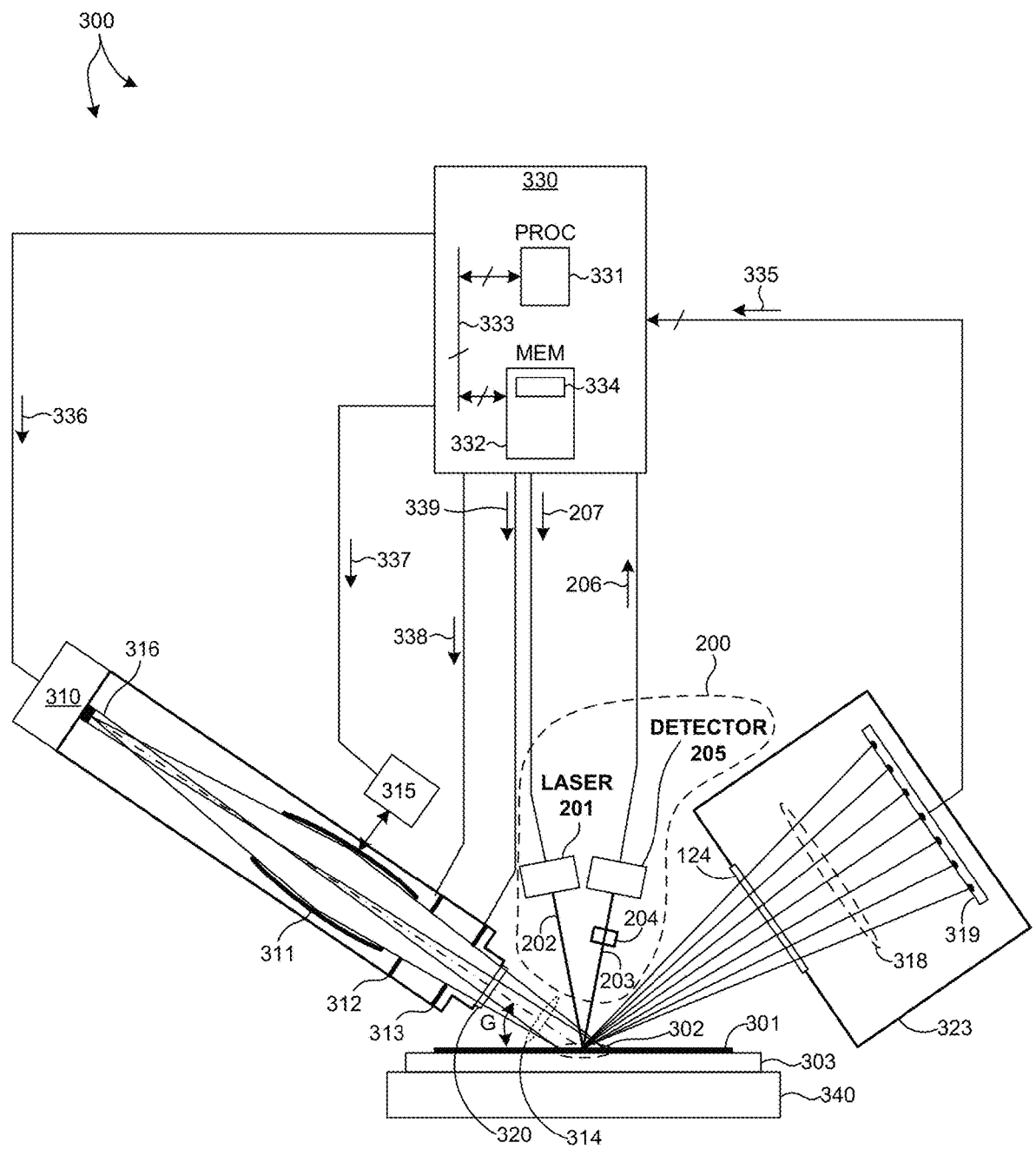
FIG. 11 is a diagram illustrative of reflective, small angle x-ray scatterometry (R-SAXS) metrology tool 300 including a wafer orientation measurement system 200 in at least one novel aspect.

In one aspect, an X-ray scatterometry based metrology system, such as T-SAXS metrology tool 100 depicted in FIG. 1 or R-SAXS metrology tool 300 depicted in FIG. 11, includes a wafer orientation measurement system 200 as illustrated in FIGS. 1 and 11. Wafer orientation measurement system 200 rapidly and accurately measures the orientation of a wafer at an X-ray scatterometry measurement location.

As depicted in FIG. 1, wafer orientation measurement system 200 includes a laser illumination source 201 emitting an illumination beam 202 directed to X-ray measurement area 102 on wafer 101. Light 203 reflected from wafer 101 in response to illumination beam 202 is focused by focusing optics 204 and detected at detector 205.

As illustrated in FIG. 1, the illumination source of wafer orientation measurement system 200 is a laser based illumination source. A laser based illumination source is advantageous because the illumination beam 202 generated by the laser based illumination source is substantially collimated. This enables the illumination source to be located relatively far away from the orientation measurement location on the wafer. This is often desirable, if not necessary, to accommodate other optical components of the X-ray scatterometry system that must be located in close proximity to the X-ray measurement spot on the wafer. However, in general, an illumination source that is not laser based may also be contemplated within the scope of this patent document. For example, an LED light source, an incandescent light source, etc., may be employed. In these embodiments, one or more focusing optics are located in the illumination beam path to focus the light generated by the illumination source onto the orientation measurement spot on the wafer.

As depicted in FIG. 1, laser illumination source 201 is communicatively coupled to computing system 130. Computing system 130 communicates command signals 207 to laser illumination source 201 to control the output of laser illumination source 201.

As depicted in FIG. 1, illumination beam 202 illuminates an orientation measurement spot on the wafer. In some embodiments, the orientation measurement spot is less than 500 micrometers in a direction of maximum extent. In some embodiments, the orientation measurement spot is less than 200 micrometers in a direction of maximum extent. In some embodiments, the orientation measurement spot is less than 100 micrometers in a direction of maximum extent.

In some embodiments, detector 205 is a two dimensional imaging device such as a camera (e.g., CCD camera, CMOS camera, etc.). In the example depicted in FIG. 1, the illumination beam 202 reflects off the back side of the wafer, and the reflected light 203 is focused onto the photosensitive surface of the camera. The photosensitive surface of detector 205 is located at the focal point of focusing optics 204. In some embodiments, the focal length of focusing optics 204 is greater than 75 millimeters.

Detector 205 is communicatively coupled to computing system 130. Detector 205 communicates signals 206 indicative of an image detected by detector 205. Computing system 130 determines the location of incidence of the reflected beam incident on detector 205 based on the image signals 206. In addition, computing system 130 estimates the orientation of wafer 101 based on the location of incidence of the reflected beam and known system parameters such as the focal length of lens 204, pixel size of detector 205, etc.

Figure 6:
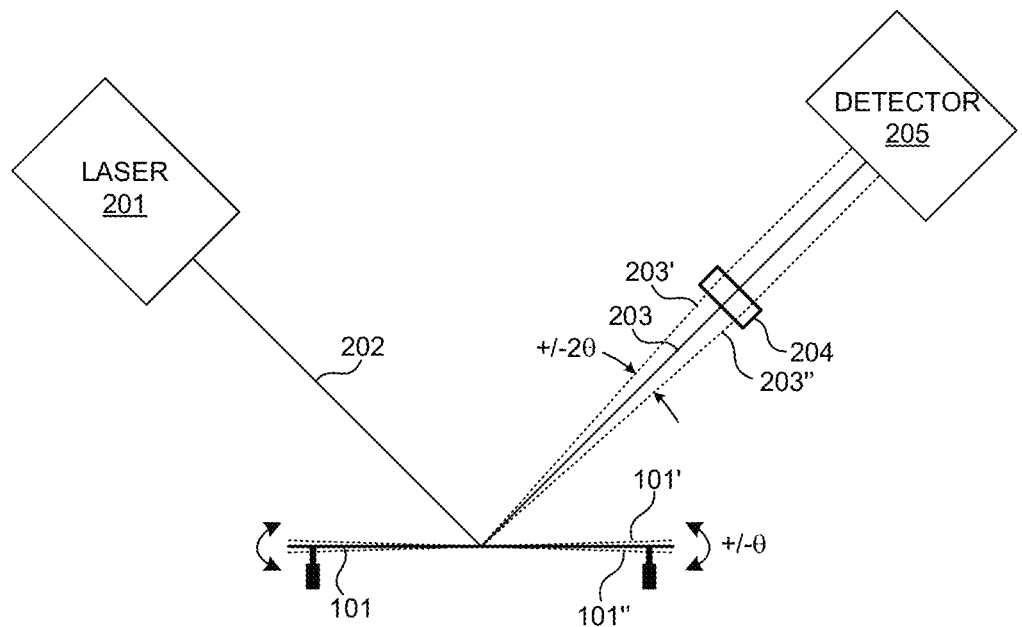
FIG. 6 is a diagram illustrative of changes in location of incidence of reflected light on a photosensitive surface of a detector as a wafer under measurement changes orientation.

As illustrated in FIG. 6, as wafer 101 changes orientation, the location of incidence of reflected light 203 on the photosensitive surface of detector 205 changes. Geometrically, a change in mechanical orientation angle, θ, of wafer 101 produces a change in the optical angle between the incidence beam 202 and the reflected beam 203, 2θ, which is twice the change in mechanical angle.

FIG. 6 depicts wafer 101 in a nominal position indicated by a solid line. Reflected light 203 is incident at a particular location on detector 205. In another instance, wafer 101 is rotated clockwise from the nominal position. The wafer in this position is indicated as wafer 101" and light reflected from wafer 101" is indicated as reflected light 203". As indicated in FIG. 6, the location of incidence of reflected light 203" is shifted from the location of incidence of reflected light 203. Similarly, in another instance, wafer 101 is rotated counter-clockwise from the nominal position. The wafer in this position is indicated as wafer 101' and light reflected from wafer 101' is indicated as reflected light 203'. As indicated in FIG. 6, the location of incidence of reflected light 203' is shifted from the location of incidence of reflected light 203 in a direction opposite the shift in location of incidence of reflected light 203". Thus, a change in position of incidence of reflected light on detector 205 indicates the change in orientation of wafer 101. If calibrated, the position of incidence of reflected light on detector 205 indicates the orientation of wafer 101 at the point of measurement on the surface of wafer 101.

Figure 7:
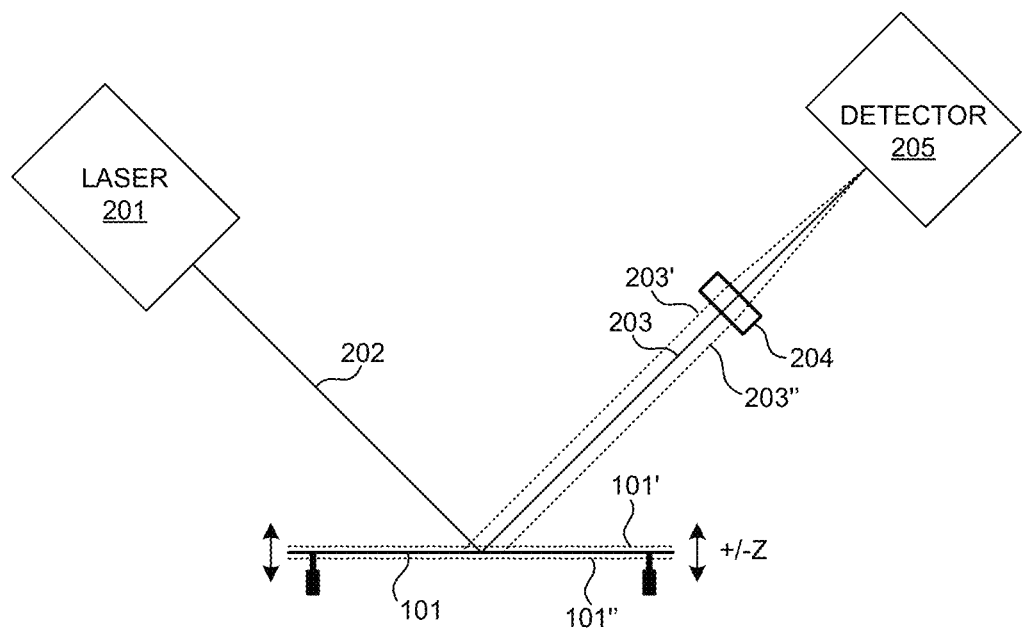
FIG. 7 is a diagram illustrative of the insensitivity of the location of incidence of reflected light on a photosensitive surface of a detector as a wafer under measurement changes z-position.

As illustrated in FIG. 7, as wafer 101 translates in a direction normal to the surface of wafer 101, the location of incidence of reflected light 203 on the photosensitive surface of detector 205 does not change. Thus, the wafer orientation measurement provided by wafer orientation measurement system 200 is insensitive to the z-position (sometimes referred to as focus position) of wafer 101. FIG. 7 depicts wafer 101 in a nominal position indicated by a solid line. Reflected light 203 is incident at a particular location on detector 205. In another instance, wafer 101 is translated upward from the nominal position as viewed on the drawing page. The wafer in this position is indicated as wafer 101' and light reflected from wafer 101' is indicated as reflected light 203'. As indicated in FIG. 7, the location of incidence of reflected light 203' is not shifted from the location of incidence of reflected light 203. Similarly, in another instance, wafer 101 is translated downward from the nominal position as viewed on the drawing page. The wafer in this position is indicated as wafer 101" and light reflected from wafer 101" is indicated as reflected light 203". As indicated in FIG. 7, the location of incidence of reflected light 203" is not shifted from the location of incidence of reflected light 203. As the wafer translates in a direction normal to the surface of the wafer, the reflected beam translates across the focus lens. Ideally, parallel rays entering the focus lens are focused to the same spot. As a result, wafer orientation system 200 is insensitive to wafer position in the direction normal to the wafer surface. In practice, focus lens 204 will be imperfect, but lens aberrations are low enough that sensitivity of wafer orientation system 200 to wafer translation in the direction normal to the wafer surface is negligible.

As illustrated in FIG. 1, wafer orientation measurement system 200 generates a measurement of wafer orientation at a measurement location based on a single measurement without any intervening stage moves. In this manner, wafer orientation measurement system 200 generates a measurement of wafer orientation without excessive delay. In addition, wafer orientation measurement system 200 is unaffected by wafer bow because the measurement of wafer orientation at a measurement location is based on a single measurement at that location, rather than multiple measurements at different locations on the wafer.

In some embodiments, an orientation measurement spot is coincident with an X-ray measurement spot. In other words, the X-ray measurement spot and the wafer orientation measurement spot spatially overlap over an area of the wafer surface. In some of these embodiments, an X-ray scatterometry measurement and a wafer orientation measurement are performed simultaneously.

Figure 8:
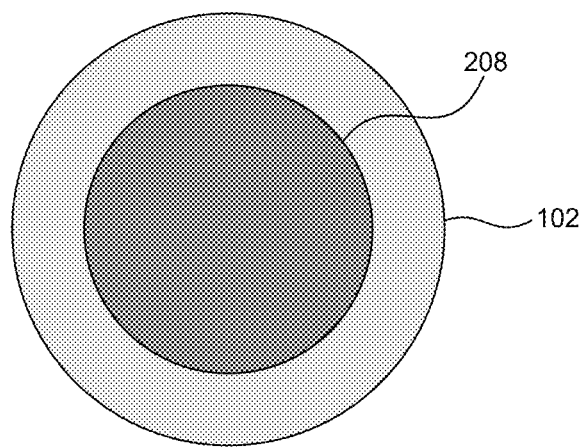
FIG. 8 depicts an X-ray measurement spot coincident with a wafer orientation measurement spot in one embodiment.

FIG. 8 depicts an X-ray measurement spot coincident with a wafer orientation measurement spot in one embodiment. As depicted in FIG. 8, X-ray measurement spot 102 is larger than wafer orientation measurement spot 208. However, the area of the wafer surface subject to wafer orientation measurement (i.e., wafer orientation measurement spot 208) is coincident with X-ray measurement spot 102. In some examples, wafer orientation measurement spot is 100 micrometers in diameter, and X-ray measurement spot 102 is greater than 100 micrometers in diameter.

Figure 9:
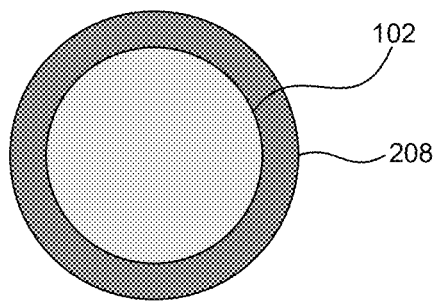
FIG. 9 depicts an X-ray measurement spot coincident with a wafer orientation measurement spot in another embodiment.

FIG. 9 depicts an X-ray measurement spot coincident with a wafer orientation measurement spot in another embodiment. As depicted in FIG. 9, X-ray measurement spot 102 is smaller than wafer orientation measurement spot 208. However, the area of the wafer surface subject to X-ray measurement (i.e., X-ray measurement spot 102) is coincident with wafer orientation measurement spot 208. In some examples, wafer orientation measurement spot is 100 micrometers in diameter, and X-ray measurement spot 102 is less than 100 micrometers in diameter.

In some other embodiments, an orientation measurement spot is not coincident with an X-ray measurement spot. In other words, the X-ray measurement spot and the wafer orientation measurement spot do not spatially overlap over an area of the wafer surface. In some of these embodiments, an X-ray scatterometry measurement and a wafer orientation measurement are performed simultaneously.

Figure 10:
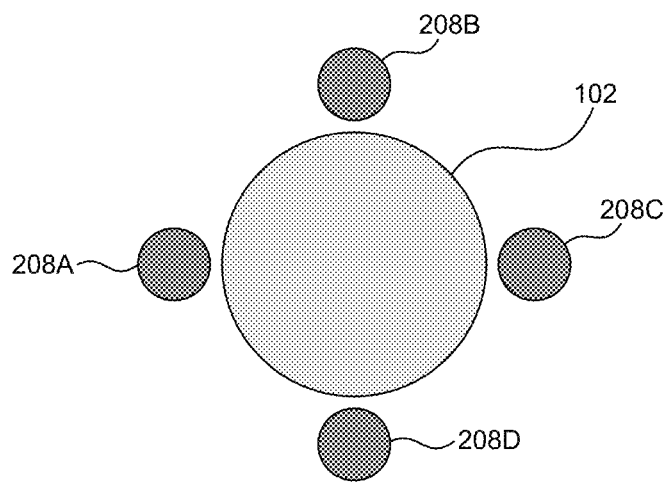
FIG. 10 depicts an X-ray measurement spot that is spatially separated from a wafer orientation measurement spot in one embodiment.

FIG. 10 depicts an X-ray measurement spot that is spatially separated from a wafer orientation measurement spot in one embodiment. As depicted in FIG. 10, four different wafer orientation measurement spots are simultaneously projected onto wafer 101 at different locations surrounding the X-ray measurement spot 102. In one embodiment, an aperture (not shown) is located in the illumination beam path from laser illumination source 201 to wafer 101. The aperture splits the illumination beam 202 into four beams incident on wafer 101 as illustrated in FIG. 10. Light reflected from these four locations is focused onto detector 205. The locations of incidence of the four reflected beams onto detector 205 are tracked to estimate the orientation of wafer 101 at X-ray measurement spot 102. In general, any number of illumination spots in close proximity to the X-ray measurement spot may be employed to measure wafer orientation at the X-ray measurement spot. However, if a wafer orientation measurement spot is spatially separated from an X-ray measurement spot, it must be reasonably close to avoid excessive error. In one example, a wafer orientation measurement spot spatially separated from an X-ray measurement spot should be located within 500 micrometers of the X-ray measurement spot. In another example, a wafer orientation measurement spot spatially separated from an X-ray measurement spot should be located within 100 micrometers of the X-ray measurement spot.

In a further aspect, computing system 130 is configured to filter image signals collected from detector 205 to improve tracking of the actual orientation of the wafer surface at the measurement location 208. In some embodiments, computing system 130 averages image signals 206 over time (e.g., moving average filter) to filter out effects of backside wafer imperfections and signal deviations. In general, the backside of a wafer includes contaminants (e.g., dust particles) that cause spurious redirection of reflected light 203 and movement of the location of incidence of reflected light 203 on detector 205. By time averaging the images collected by detector 205, these spurious movements are effectively filtered out. In some other embodiments, computing system 130 spatially filters image signals 206. In one example, computing system 130 estimates the location of incidence of a reflected beam on detector 205 by comparing the shape of a measured spot with the expected shape of the spot on the detector. The expected shape is known based on the shape of the illumination beam incident on the wafer and the known properties of any optical elements (e.g., focusing optics 204 between wafer 101 and detector 205. The expected shape of the spot on the detector is fit to the actual spot on the detector, and non-zero valued pixels outside the expected shape are discarded.

Computing system 130 tracks image signals collected over time to estimate wafer orientation as a function of time. In a further aspect, computing system 130 transforms the estimate of wafer orientation as a function of time from the time domain to the frequency domain. In one example, computing system 130 employs a Fast Fourier Transform (FFT) algorithm to extract the frequency components of the time series data. The amplitudes of the frequency components are indicative of the position stability of the wafer under measurement and the frequency components themselves are indicative of the modal characteristics of the wafer under measurement. In this manner, the wafer orientation measurement system is employed to monitor wafer modal dynamics and position stability during measurement.

As described herein, a wafer orientation measurement system precisely estimates changes in orientation of a wafer at an orientation measurement spot based on changes of location of incidence of reflected light at the detector. In a further aspect, a wafer orientation measurement system is calibrated to identify the orientation of the wafer with respect to an incident X-ray beam. In this manner, a wafer orientation measurement system provides accurate estimates of the orientation of the wafer at an orientation measurement spot with respect to the incident X-ray beam.

In some embodiments, a distance sensor measuring a distance to the front side of a wafer under measurement is employed to estimate the orientation of the wafer at the orientation measurement spot. In these embodiments, distance measurements are performed at many locations around the orientation measurement spot and a plane is fit to the data set to estimate the orientation of the wafer with respect to the reference frame to which the distance sensor is mounted. The orientation estimated by the distance sensor is treated as the measured orientation of the wafer orientation measurement system at the orientation measurement spot. Changes from the calibrated orientation are measured by the wafer orientation measurement system as described herein.

In some other embodiments, the X-ray metrology system itself is employed to estimate the orientation of the wafer at the orientation measurement spot. In these embodiments, the X-ray illumination beam is directed to the wafer at the orientation measurement spot and the diffracted light is detected by the X-ray detector (e.g., detector 119). The wafer is rotated through a sequence of orientations around the presumed orientation of normal incidence. The measured diffraction patterns are analyzed to find the orientation about which the diffraction patterns are symmetric. This orientation is treated as the zero angle, i.e., the orientation angle of the wafer that is normal to the incident X-ray illumination beam. The zero angle is treated as the measured zero angle by the wafer orientation measurement system at the orientation measurement spot. Changes from the calibrated zero angle are measured by the wafer orientation measurement system as described herein.

In general, the calibration of the wafer orientation measurement system may be performed at each measurement site, or at one or more measurement sites on the wafer surface.

In another further aspect, a wafer positioning system of an X-ray based metrology system positions a wafer under measurement based on measurements provided by a wafer orientation measurement system as described herein.

In some embodiments, a wafer positioning system is controlled in a closed loop manner based on the wafer orientation measurement provided by the wafer orientation measurement system. In one example, computing system 130 estimates the orientation of wafer 101 based at an orientation measurement spot 208 that coincides with an X-ray measurement spot 102. In response to the measured orientation, computing system 130 communicates control commands to actuators of wafer positioning system 140 to position the wafer at a desired orientation based on the difference between the measured orientation and the desired orientation.

In some embodiments, a wafer positioning system is controlled in an open loop manner based on the wafer orientation measurement provided by the wafer orientation measurement system. In one example, a map of the orientation of wafer 101 at a number of different measurement sites on the wafer is generated based on orientation measurements performed by the wafer orientation measurement system at each different measurement site. The map is employed to correct the orientation setpoint employed for each X-ray scatterometry measurement performed at each measurement site.

In one example, Z-actuators 150A-C are controlled to adjust the Z-position, Rx orientation, Ry orientation, or any combination thereof, of wafer 101. In one example, the orientation of wafer 101 is corrected by Z-actuators 150A-C. The tilt correction may be based on a map of wafer tilt or a value of tilt measured locally by wafer orientation measurement system 200. In general, the orientation of wafer 101 may be measured in two orthogonal directions, e.g., Rx and Ry orientations.

In some embodiments, the wafer orientation measurement system is mounted to a reference frame to which the X-ray illumination source is mounted. In these embodiments, the wafer orientation measurement system measures orientation with respect to the incidence X-ray beam directly.

In some other embodiments, the wafer orientation measurement system is mounted to a stage reference frame that moves with respect to the X-ray illumination source. In these embodiments, the wafer orientation measurement system measures orientation with respect to the incidence X-ray beam indirectly. To obtain a measurement of orientation with respect to the X-ray illumination source, the measured orientation with respect to the stage reference frame is transformed to the reference frame to which the X-ray illumination source is mounted. This transformation is a function of the movement of the stage reference frame with respect to the reference frame to which the X-ray illumination source is mounted. For example, FIG. 5 depicts a wafer orientation measurement system 200 mounted to a stage reference frame 143. In the depicted embodiment, the stage reference frame rotates about axis 153 and translates in the $X_{NF}$ direction with respect to the reference frame 141 to which the X-ray illumination source is mounted.

A wafer orientation measurement system as described herein may be implemented as part of a transmission X-ray metrology system, a reflective X-ray metrology system, or an X-ray scatterometry based metrology system operable in both reflective and transmissive modes.

FIG. 11 depicts a Reflective, Small Angle X-ray Scatterometry (RSAXS) metrology system including a wafer orientation positioning system as described herein.

In some embodiments, RSAXS measurements of a semiconductor wafer are performed over a range of wavelengths, angles of incidence, and azimuth angles with a small beam spot size. In one aspect, the RSAXS measurements are performed with x-ray radiation in the soft x-ray (SXR) region (i.e., 80-3000 eV) at grazing angles of incidence in the range of 5-20 degrees. Grazing angles for a particular measurement application are selected to achieve a desired penetration into the structure under measurement and maximize measurement information content with a small beam spot size (e.g., less than 50 micrometers).

As shown in FIG. 11, RSAXS system 300 performs RSAXS measurements over an X-ray measurement area 302 of a specimen 301 illuminated by an incident illumination beam spot. Furthermore, RSAXS system 300 includes wafer orientation measurement system 200 that measures the orientation of wafer 301 at an orientation measurement spot as described hereinbefore.

In the depicted embodiment, metrology tool 300 includes an x-ray illumination source 310, focusing optics 311, beam divergence control slit 312, and slit 313. The x-ray illumination source 310 is configured to generate SXR radiation suitable for RSAXS measurements. X-ray illumination source 310 is a polychromatic, high-brightness, large etendue source. In some embodiments, the x-ray illumination source 310 is configured to generate x-ray radiation in a range between 80-3000 electron-volts. In general, any suitable high-brightness x-ray illumination source capable of generating high brightness SXR at flux levels sufficient to enable high-throughput, inline metrology may be contemplated to supply x-ray illumination for RSAXS measurements.

In some embodiments, an x-ray source includes a tunable monochromator that enables the x-ray source to deliver x-ray radiation at different, selectable wavelengths. In some embodiments, one or more x-ray sources are employed to ensure that the x-ray source supplies light at wavelengths that allow sufficient penetration into the specimen under measurement.

In some embodiments, illumination source 310 is a high harmonic generation (HHG) x-ray source. In some other embodiments, illumination source 310 is a wiggler/undulator synchrotron radiation source (SRS). An exemplary wiggler/undulator SRS is described in U.S. Pat. Nos. 8,941,336 and 8,749,179, the contents of which are incorporated herein by reference in their entireties.

In some other embodiments, illumination source 310 is a laser produced plasma (LPP) light source. In some of these embodiments the LPP light source includes any of Xenon, Krypton, Argon, Neon, and Nitrogen emitting materials. In general, the selection of a suitable LPP target material is optimized for brightness in resonant SXR regions. For example, plasma emitted by Krypton provides high brightness at the Silicon K-edge. In another example, plasma emitted by Xenon provides high brightness throughout the entire SXR region of (80-3000 eV). As such, Xenon is a good choice of emitting material when broadband SXR illumination is desired.

LPP target material selection may also be optimized for reliable and long lifetime light source operation. Noble gas target materials such as Xenon, Krypton, and Argon are inert and can be reused in a closed loop operation with minimum or no decontamination processing. An exemplary SXR illumination source is described in U.S. patent application Ser. No. 15/867,633, the content of which is incorporated herein by reference in its entirety.

In a further aspect, the wavelengths emitted by the illumination source (e.g., illumination source 310) are selectable. In some embodiments, illumination source 310 is a LPP light source controlled by computing system 330 to maximize flux in one or more selected spectral regions. Laser peak intensity at the target material controls the plasma temperature and thus the spectral region of emitted radiation. Laser peak intensity is varied by adjusting pulse energy, pulse width, or both. In one example, a 100 picosecond pulse width is suitable for generating SXR radiation.

As depicted in FIG. 11, computing system 330 communicates command signals 336 to illumination source 310 that cause illumination source 310 to adjust the spectral range of wavelengths emitted from illumination source 310. In one example, illumination source 310 is a LPP light source, and the LPP light source adjusts any of a pulse duration, pulse frequency, and target material composition to realize a desired spectral range of wavelengths emitted from the LPP light source.

By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 310.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

X-ray illumination source 310 produces x-ray emission over a source area having finite lateral dimensions (i.e., non-zero dimensions orthogonal to the beam axis. In one aspect, the source area of illumination source 110 is characterized by a lateral dimension of less than 20 micrometers. In some embodiments, the source area is characterized by a lateral dimension of 10 micrometers or less. Small source size enables illumination of a small target area on the specimen with high brightness, thus improving measurement precision, accuracy, and throughput.

In general, x-ray optics shape and direct x-ray radiation to specimen 301. In some examples, the x-ray optics collimate or focus the x-ray beam onto X-ray measurement area 302 of specimen 301 to less than 1 milliradian divergence using multilayer x-ray optics. In some embodiments, the x-ray optics include one or more x-ray collimating mirrors, x-ray apertures, x-ray beam stops, refractive x-ray optics, diffractive optics such as zone plates, Schwarzschild optics, Kirkpatrick-Baez optics, Montel optics, Wolter optics, specular x-ray optics such as ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

As depicted in FIG. 11, focusing optics 311 focuses source radiation onto a metrology target located on specimen 301. The finite lateral source dimension results in finite X-ray measurement spot 302 on the target defined by the rays 316 coming from the edges of the source and any beam shaping provided by beam slits 312 and 313.

In some embodiments, focusing optics 311 includes elliptically shaped focusing optical elements. In the embodiment depicted in FIG. 11, the magnification of focusing optics 311 at the center of the ellipse is approximately one. As a result, the illumination spot size projected onto the surface of specimen 301 is approximately the same size as the illumination source, adjusted for beam spread due to the nominal grazing incidence angle (e.g., 5-20 degrees).

In a further aspect, focusing optics 311 collect source emission and select one or more discrete wavelengths or spectral bands, and focus the selected light onto specimen 301 at grazing angles of incidence in the range 5-20 degrees.

The nominal grazing incidence angle is selected to achieve a desired penetration of the metrology target to maximize signal information content while remaining within metrology target boundaries. The critical angle of hard x-rays is very small, but the critical angle of soft x-rays is significantly larger. As a result of this additional measurement flexibility RSAXS measurements probe more deeply into the structure with less sensitivity to the precise value of the grazing incidence angle.

In some embodiments, focusing optics 311 include graded multi-layers that select desired wavelengths or ranges of wavelengths for projection onto specimen 301. In some examples, focusing optics 311 includes a graded multi-layer structure (e.g., layers or coatings) that selects one wavelength and projects the selected wavelength onto specimen 301 over a range of angles of incidence. In some examples, focusing optics 311 includes a graded multi-layer structure that selects a range of wavelengths and projects the selected wavelengths onto specimen 301 over one angle of incidence. In some examples, focusing optics 311 includes a graded multi-layer structure that selects a range of wavelengths and projects the selected wavelengths onto specimen 301 over a range of angles of incidence.

Graded multi-layered optics are preferred to minimize loss of light that occurs when single layer grating structures are too deep. In general, multi-layer optics select reflected wavelengths. The spectral bandwidth of the selected wavelengths optimizes flux provided to specimen 301, information content in the measured diffracted orders, and prevents degradation of signal through angular dispersion and diffraction peak overlap at the detector. In addition, graded multi-layer optics are employed to control divergence. Angular divergence at each wavelength is optimized for flux and minimal spatial overlap at the detector.

In some examples, graded multi-layer optics select wavelengths to enhance contrast and information content of diffraction signals from specific material interfaces or structural dimensions. For example, the selected wavelengths may be chosen to span element-specific resonance regions (e.g., Silicon K-edge, Nitrogen, Oxygen K-edge, etc.). In addition, in these examples, the illumination source may also be tuned to maximize flux in the selected spectral region (e.g., HHG spectral tuning, LPP laser tuning, etc.)

In some other examples, little to no prior structural information is available at the time of measurement. In these examples, multiple wavelengths (e.g., 3-4) are selected to enable measurement of diffraction patterns across the absorption edge. The measured signals enable model-free measurement of structural properties with no prior information except the elemental composition of the structures under measurement using, for example, multiple wavelength anomalous diffraction techniques. After estimating structural properties based on model-free measurements, parameter estimates may be further refined using model-based measurement techniques.

In some examples, the anomalous scattering factors (i.e., scattering properties) of the metrology target under measurement are not known apriori. In these examples, film multilayer reflectivity is measured at multiple resonant wavelengths. Angular excursions of Bragg peaks provide sufficient information to extract the anomalous scattering factors.

In some examples, non-resonant x-ray reflectivity measurements provide independent estimates of multilayer period and interface roughness parameters, which improve the fitting of model-based measurements. In some embodiments, a combined metrology tool includes a multiple wavelength SXR diffraction subsystem as described herein and an x-ray reflectometry subsystem to improve measurement throughput. In one embodiment, the multiple wavelength SXR diffraction subsystem and the x-ray reflectometry subsystem employ orthogonal planes of incidence that enable simultaneous measurements or sequential measurements without having to move the specimen under measurement or either of the optical measurement subsystems. In some embodiments, wafer rotation, detector rotation, or both, may be employed to extend the range of angles of incidence if the AOI range provided by the SXR multilayer mirrors is too small for x-ray reflectometry.

In some embodiments, focusing optics 311 include a plurality of reflective optical elements each having an elliptical surface shape. Each reflective optical element includes a substrate and a multi-layer coating tuned to reflect a different wavelength or range of wavelengths. In some embodiments, a plurality of reflective optical elements (e.g., 1-5) each reflecting a different wavelength or range of wavelengths are arranged at each angle of incidence. In a further embodiment, multiple sets (e.g., 2-5) of reflective optical elements each reflecting a different wavelength or range of wavelengths are arranged each at set at a different angle of incidence. In some embodiments, the multiple sets of reflective optical elements simultaneously project illumination light onto specimen 301 during measurement. In some other embodiments, the multiple sets of reflective optical elements sequentially project illumination light onto specimen 301 during measurement. In these embodiments, active shutters or apertures are employed to control the illumination light projected onto specimen 301.

In a further aspect, the ranges of wavelengths, AOI, Azimuth, or any combination thereof, projected onto the same metrology area, are adjusted by actively positioning one or more mirror elements of the focusing optics. As depicted in FIG. 11, computing system 330 communicates command signals to actuator system 315 that causes actuator system 315 to adjust the position, alignment, or both, of one or more of the optical elements of focusing optics 311 to achieve the desired ranges of wavelengths, AOI, Azimuth, or any combination thereof, projected onto specimen 301.

In general, the angle of incidence is selected for each wavelength to optimize penetration and absorption of the illumination light by the metrology target under measurement. In many examples, multiple layer structures are measured and angle of incidence is selected to maximize signal information associated with the desired layers of interest. In the example of overlay metrology, the wavelength(s) and angle(s) of incidence are selected to maximize signal information resulting from interference between scattering from the previous layer and the current layer. In addition, azimuth angle is also selected to optimize signal information content. In addition, azimuth angle is selected to ensure angular separation of diffraction peaks at the detector.

In a further aspect, an RSAX metrology system (e.g., metrology tool 300) includes one or more beam slits or apertures to shape the illumination beam 314 incident on specimen 301 and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to minimize overlap of diffraction orders on the detector.

FIG. 11 depicts a beam divergence control slit 312 located in the beam path between focusing optics 311 and beam shaping slit 313. Beam divergence control slit 312 limits the divergence of the illumination provided to the specimen under measurement. Beam shaping slit 313 is located in the beam path between beam divergence control slit 312 and specimen 301. Beam shaping slit 313 further shapes the incident beam 314 and selects the illumination wavelength(s) of incident beam 314. Beam shaping slit 313 is located in the beam path immediately before specimen 301. In one aspect, the slits of beam shaping slit 313 are located in close proximity to specimen 301 to minimize the enlargement of the incident beam spot size due to beam divergence defined by finite source size.

X-ray detector 319 collects x-ray radiation 318 scattered from specimen 101 and generates an output signals 335 indicative of properties of specimen 301 that are sensitive to the incident x-ray radiation in accordance with a RSAXS measurement modality. In some embodiments, scattered x-rays 318 are collected by x-ray detector 319 while specimen positioning system 340 locates and orients specimen 301 to produce angularly resolved scattered x-rays.

In some embodiments, a RSAXS system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 319 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 330 via output signals 135 for further processing and storage.

Diffraction patterns resulting from simultaneous illumination of a periodic target with multiple illumination wavelengths are separated at the detector plane due to angular dispersion in diffraction. In these embodiments, integrating detectors are employed. The diffraction patterns are measured using area detectors, e.g., vacuum-compatible backside CCD or hybrid pixel array detectors. Angular sampling is optimized for Bragg peak integration. If pixel level model fitting is employed, angular sampling is optimized for signal information content. Sampling rates are selected to prevent saturation of zero order signals.

In a further aspect, a RSAXS system is employed to determine properties of a specimen (e.g., structural parameter values) based on one or more diffraction orders of scattered light. As depicted in FIG. 11, metrology tool 300 includes a computing system 330 employed to acquire signals 335 generated by detector 319 and determine properties of the specimen based at least in part on the acquired signals.

In some examples, metrology based on RSAXS involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

It is desirable to perform measurements at large ranges of wavelength, angle of incidence and azimuth angle to increase the precision and accuracy of measured parameter values. This approach reduces correlations among parameters by extending the number and diversity of data sets available for analysis.

Measurements of the intensity of diffracted radiation as a function of illumination wavelength and x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

In another further aspect, computing system 130 is configured to generate a structural model (e.g., geometric model, material model, or combined geometric and material model) of a measured structure of a specimen, generate a T-SAXS response model that includes at least one geometric parameter from the structural model, and resolve at least one specimen parameter value by performing a fitting analysis of T-SAXS measurement data with the T-SAXS response model. The analysis engine is used to compare the simulated T-SAXS signals with measured data thereby allowing the determination of geometric as well as material properties such as electron density of the sample. In the embodiment depicted in FIG. 1, computing system 130 is configured as a model building and analysis engine configured to implement model building and analysis functionality as described herein.

Figure 12:
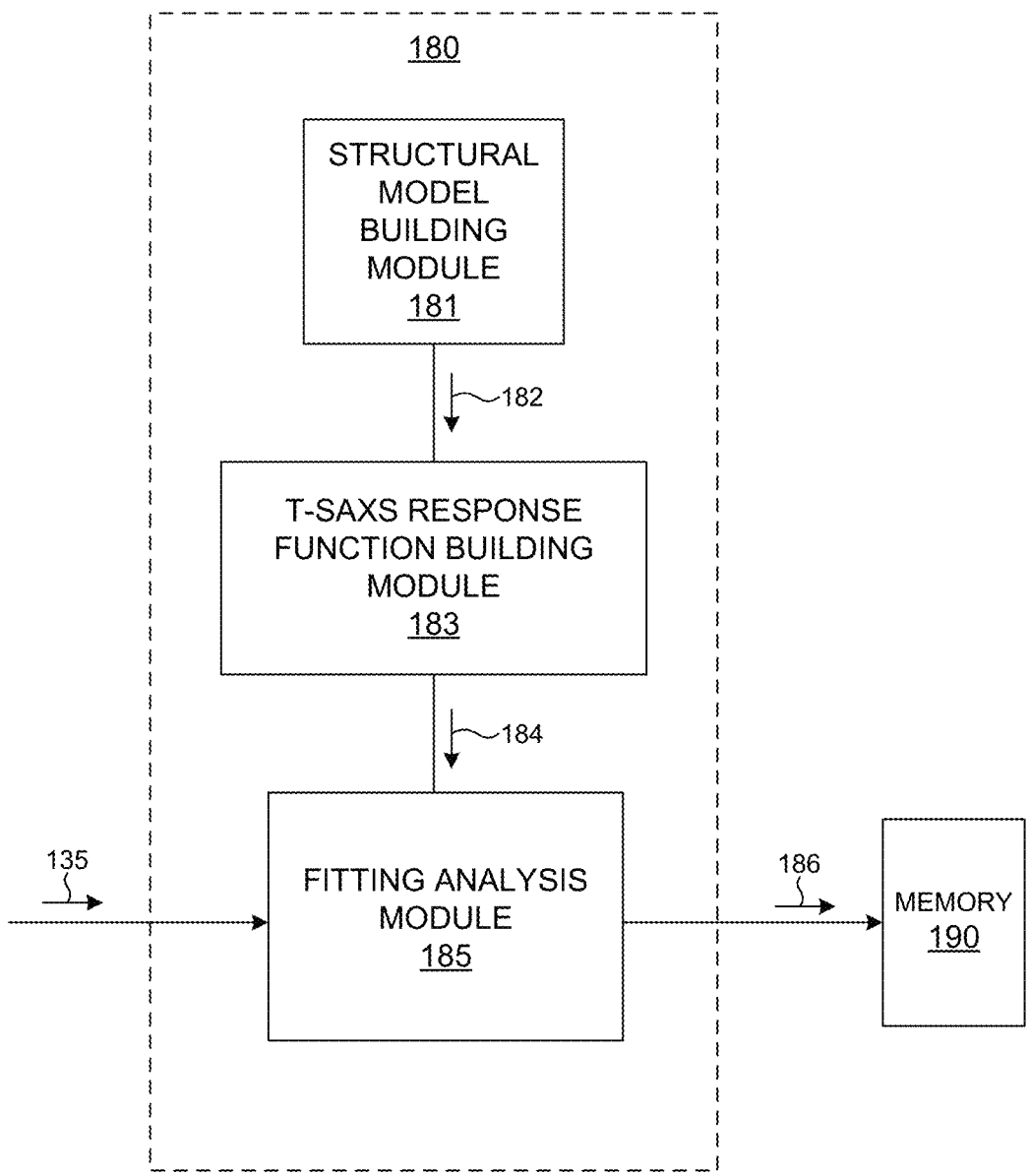
FIG. 12 is a diagram illustrative of a model building and analysis engine configured to resolve specimen parameter values based on x-ray scatterometry data in accordance with the methods described herein.

FIG. 12 is a diagram illustrative of an exemplary model building and analysis engine 180 implemented by computing system 130. As depicted in FIG. 12, model building and analysis engine 180 includes a structural model building module 181 that generates a structural model 182 of a measured structure of a specimen. In some embodiments, structural model 182 also includes material properties of the specimen. The structural model 182 is received as input to T-SAXS response function building module 183. T-SAXS response function building module 183 generates a T-SAXS response function model 184 based at least in part on the structural model 182. In some examples, the T-SAXS response function model 184 is based on x-ray form factors, $$F(\vec{q}) = \int \rho(\vec{r}) e^{-i\vec{q}\cdot\vec{r}} d\vec{r} \qquad (1)$$

where F is the form factor, q is the scattering vector, and ρ(r) is the electron density of the specimen in spherical coordinates. The x-ray scattering intensity is then given by $$I(\vec{q}) = F^*F \qquad (2)$$

T-SAXS response function model 184 is received as input to fitting analysis module 185. The fitting analysis module 185 compares the modeled T-SAXS response with the corresponding measured data to determine geometric as well as material properties of the specimen.

In some examples, the fitting of modeled data to experimental data is achieved by minimizing a chi-squared value. For example, for T-SAXS measurements, a chi-squared value can be defined as $$\chi^2_{SAXS} = \frac{1}{N_{SAXS}} \sum_{j}^{N_{SAXS}} \frac{\left(S_j^{SAXSmodel}(v_1, \cdots, v_L) - s_j^{SAXS\,experiment}\right)^2}{\sigma^2_{SAXS,j}} \quad (3)$$

Where, $S_j^{SAXS\,experiment}$ the measured T-SAXS signals 135 in the "channel" j, where the index j describes a set of system parameters such as diffraction order, energy, angular coordinate, etc. $S_j^{SAXS\,model}(v_1 \ldots, v_L)$ is the modeled T-SAXS signal $S_j$ for the "channel" j, evaluated for a set of structure (target) parameters $v_1, \ldots, v_L$, where these parameters describe geometric (CD, sidewall angle, overlay, etc.) and material (electron density, etc.). $\sigma_{SAXS,j}$ is the uncertainty associated with the jth channel. $N_{SAXS}$ is the total number of channels in the x-ray metrology. L is the number of parameters characterizing the metrology target.

Equation (3) assumes that the uncertainties associated with different channels are uncorrelated. In examples where the uncertainties associated with the different channels are correlated, a covariance between the uncertainties, can be calculated. In these examples a chi-squared value for T-SAXS measurements can be expressed as $$\chi^2_{SAXS} = \frac{1}{N_{SAXS}} \left(\vec{S}_j^{SAXS.model}(v_1, \ldots, v_M) - \vec{S}_j^{SAXS.experiment}\right)^T \quad (4)$$
$$V_{SAXS}^{-1}\left(\vec{S}_j^{SAXS.model}(v_1, \ldots, v_M) - \vec{S}_j^{SAXS.experiment}\right)$$

where, $V_{SAXS}$ is the covariance matrix of the SAXS channel uncertainties, and T denotes the transpose.

In some examples, fitting analysis module 185 resolves at least one specimen parameter value by performing a fitting analysis on T-SAXS measurement data 135 with the T-SAXS response model 184. In some examples, $\chi^2_{SAXS}$ is optimized.

As described hereinbefore, the fitting of T-SAXS data is achieved by minimization of chi-squared values. However, in general, the fitting of T-SAXS data may be achieved by other functions.

The fitting of T-SAXS metrology data is advantageous for any type of T-SAXS technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing T-SAXS beam interaction with the specimen are used.

In general, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In some examples, model building and analysis engine 180 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In another further aspect, an initial estimate of values of one or more parameters of interest is determined based on T-SAXS measurements performed at a single orientation of the incident x-ray beam with respect to the measurement target. The initial, estimated values are implemented as the starting values of the parameters of interest for a regression of the measurement model with measurement data collected from T-SAXS measurements at multiple orientations. In this manner, a close estimate of a parameter of interest is determined with a relatively small amount of computational effort, and by implementing this close estimate as the starting point for a regression over a much larger data set, a refined estimate of the parameter of interest is obtained with less overall computational effort.

In another aspect, metrology tool 100 includes a computing system (e.g., computing system 130) configured to implement beam control functionality as described herein. In the embodiment depicted in FIG. 1, computing system 130 is configured as a beam controller operable to control any of the illumination properties such as intensity, divergence, spot size, polarization, spectrum, and positioning of the incident illumination beam 116.

As illustrated in FIG. 1, computing system 130 is communicatively coupled to detector 119. Computing system 130 is configured to receive measurement data 135 from detector 119. In one example, measurement data 135 includes an indication of the measured response of the specimen (i.e., intensities of the diffraction orders). Based on the distribution of the measured response on the surface of detector 119, the location and area of incidence of illumination beam 116 on specimen 101 is determined by computing system 130. In one example, pattern recognition techniques are applied by computing system 130 to determine the location and area of incidence of illumination beam 116 on specimen 101 based on measurement data 135. In some examples, computing system 130 communicates command signals 137 to x-ray illumination source 110 to select the desired illumination wavelength. In some examples, computing system 130 communicates command signals 138 to actuator subsystem 111' to redirect the x-ray emission relative to base frame 141 to achieve a desired beam direction. In some examples, computing system 130 communicates command signals 136 to beam shaping slit mechanism 120 to change the beam spot size such that incident illumination beam 116 arrives at specimen 101 with the desired beam spot size and orientation. In one example, command signals 136 cause rotary actuator 122, depicted in FIG. 5, to rotate beam shaping slit mechanism 120 to a desired orientation with respect to specimen 101. In another example, command signals 136 cause actuators associated with each of slits 126-129 to change position to reshape the incident beam 116 to a desired shape and size. In some other examples, computing system 130 communicates a command signal to wafer positioning system 140 to position and orient specimen 101 such that incident illumination beam 116 arrives at the desired location and angular orientation with respect to specimen 101.

It should be recognized that the various steps described throughout the present disclosure may be carried out by a single computer system, such as computing systems 130 and 330, or, alternatively, a multiple computer system. Moreover, different subsystems of metrology systems 100 and 300, such as specimen positioning systems 140 and 340 and wafer orientation measurement system 200 may include a computer system suitable for carrying out at least a portion of the steps described herein. Therefore, the aforementioned description should not be interpreted as a limitation on the present invention but merely an illustration. Further, the one or more computing systems 130 and 330 may be configured to perform any other step(s) of any of the method embodiments described herein.

In addition, computer systems 130 and 330 may be communicatively coupled to x-ray illumination sources 110 and 310, illumination source 201, beam shaping slit mechanisms 120 and 320, specimen positioning systems 140 and 340, and detectors 119, 205, and 319 in any manner known in the art. For example, one or more computing systems 130 and 330 may be coupled to computing systems associated with x-ray illumination sources 110 and 310, illumination source 201, beam shaping slit mechanisms 120 and 320, specimen positioning systems 140 and 340, and detectors 119, 205, and 319, respectively. In another example, any of x-ray illumination sources 110 and 310, illumination source 201, beam shaping slit mechanisms 120 and 320, specimen positioning systems 140 and 340, and detectors 119, 205, and 319 may be controlled directly by a single computer system coupled to computer systems 130 and 330, respectively.

Computer system 130 and 330 may be configured to receive and/or acquire data or information from the subsystems of the system (e.g., x-ray illumination sources 110, 201, and 310, beam shaping slit mechanisms 120 and 320, specimen positioning systems 140 and 340, detectors 119, 205, and 319, and the like) by a transmission medium that may include wireline and/or wireless portions. In this manner, the transmission medium may serve as a data link between computer systems 130 and 330 and other subsystems of systems 100 and 300, respectively.

Computer systems 130 and 330 of metrology systems 100 and 300, respectively, may be configured to receive and/or acquire data or information (e.g., measurement results, modeling inputs, modeling results, etc.) from other systems by a transmission medium that may include wireline and/or wireless portions. In this manner, the transmission medium may serve as a data link between computer system 130 and 330 and other systems (e.g., memory on-board metrology systems 100 and 300, external memory, or external systems). For example, the computing system 130 may be configured to receive x-ray measurement data or wafer orientation measurement data (e.g., signals 135) from a storage medium (i.e., memory 132 or 190) via a data link. For instance, spectral results obtained using detector 119, wafer orientation measurement results obtained using detector 205, or both, may be stored in a permanent or semi-permanent memory device (e.g., memory 132 or 190). In this regard, the measurement results may be imported from on-board memory or from an external memory system. Moreover, computer systems 130 and 330 may send data to other systems via a transmission medium. For instance, specimen parameter values 186 determined by computer system 130 may be stored in a permanent or semi-permanent memory device (e.g., memory 190). In this regard, measurement results may be exported to another system.

Computing systems 130 and 330 may include, but is not limited to, a personal computer system, cloud computing system, mainframe computer system, workstation, image computer, parallel processor, or any other device known in the art. In general, the term "computing system" may be broadly defined to encompass any device having one or more processors, which execute instructions from a memory medium.

Program instructions 134 and 334 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). In another example, as illustrated in FIG. 11, program instructions stored in memory 332 are transmitted to processor 331 over bus 333. Program instructions 334 are stored in a computer readable medium (e.g., memory 332). Exemplary computer-readable media include read-only memory, a random access memory, a magnetic or optical disk, or a magnetic tape.

Figure 13:
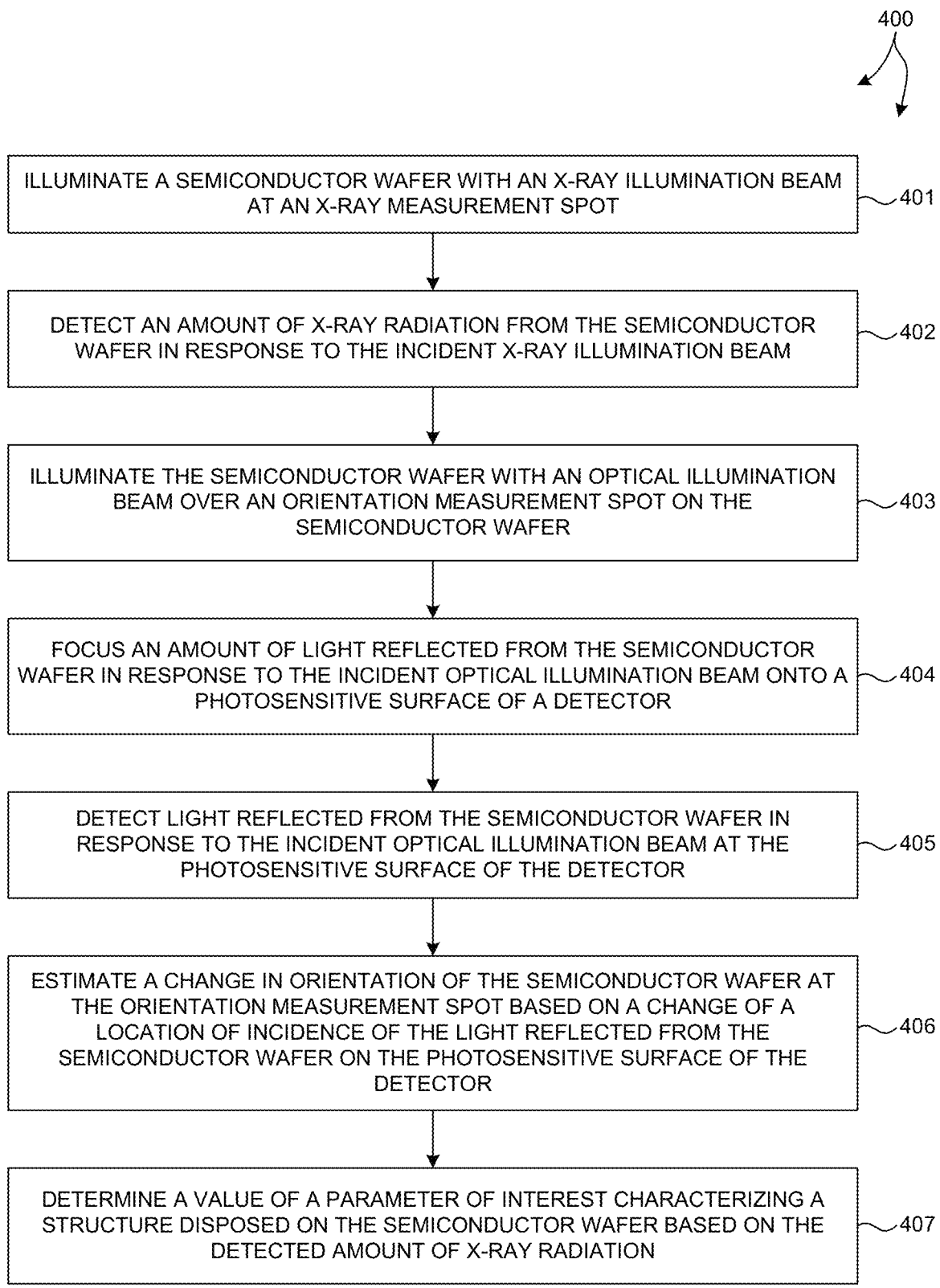
FIG. 13 depicts a flowchart illustrative of an exemplary method 400 of measuring the orientation of a wafer at an orientation measurement spot on a wafer as described herein.

FIG. 13 illustrates a method 400 suitable for implementation by metrology systems 100 and 300 of the present invention. In one aspect, it is recognized that data processing blocks of method 400 may be carried out via a pre-programmed algorithm executed by one or more processors of computing system 130 or computing system 330. While the following description is presented in the context of metrology systems 100 and 300, it is recognized herein that the particular structural aspects of metrology systems 100 and 300 do not represent limitations and should be interpreted as illustrative only.

In block 401, a semiconductor wafer is illuminated with an x-ray illumination beam at an x-ray measurement spot.

In block 402, an amount of x-ray radiation is detected from the semiconductor wafer in response to the incident x-ray illumination beam.

In block 403, the semiconductor wafer is illuminated with an optical illumination beam over an orientation measurement spot on the semiconductor wafer.

In block 404, an amount of light reflected from the semiconductor wafer in response to the incident optical illumination beam is focused onto a photosensitive surface of a detector.

In block 405, light reflected from the semiconductor wafer in response to the incident optical illumination beam is detected at the photosensitive surface of the detector.

In block 406, a change in orientation of the semiconductor wafer at the orientation measurement spot is estimated based on a change of a location of incidence of the light reflected from the semiconductor wafer on the photosensitive surface of the detector.

In block 407, a value of a parameter of interest characterizing a structure disposed on the semiconductor wafer is determined based on the detected amount of x-ray radiation.

In some embodiments, scatterometry measurements as described herein are implemented as part of a fabrication process tool. Examples of fabrication process tools include, but are not limited to, lithographic exposure tools, film deposition tools, implant tools, and etch tools. In this manner, the results of a T-SAXS analysis are used to control a fabrication process. In one example, T-SAXS measurement data collected from one or more targets is sent to a fabrication process tool. The T-SAXS measurement data is analyzed as described herein and the results used to adjust the operation of the fabrication process tool.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, thickness, overlay, and material parameters such as electron density, composition, grain structure, morphology, stress, strain, and elemental identification. In some embodiments, the metrology target is a periodic structure. In some other embodiments, the metrology target is aperiodic.

In some examples, measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM) are performed with T-SAXS measurement systems as described herein.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
an x-ray illumination source configured to generate an x-ray illumination beam incident on a semiconductor wafer at an x-ray measurement spot;
an x-ray detector configured to detect an amount of x-ray radiation from the semiconductor wafer in response to the incident x-ray illumination beam;
a wafer orientation measurement system comprising:
an optical illumination source configured to generate an illumination beam directed to an orientation measurement spot on the semiconductor wafer;
an optical detector configured to detect light reflected from the semiconductor wafer in response to the incident optical illumination beam;
one or more focusing optical elements configured to focus the light reflected from the semiconductor wafer in response to the incident illumination beam onto the detector, wherein the detector is located at or near a focal plane of the one or more focusing optical elements; and
a computing system configured to estimate a change in orientation of the semiconductor wafer at the orientation measurement spot based on a change of a location of incidence of the light reflected from the semiconductor wafer on the optical detector.

2. The metrology system of claim 1, wherein the x-ray illumination source and the x-ray detector are configured in a transmissive measurement mode, a reflective measurement mode, or a combination thereof.

3. The metrology system of claim 1, wherein the change in orientation of the semiconductor wafer at the orientation measurement spot is about an axis orthogonal to an axis normal to a planar surface of the semiconductor wafer.

4. The metrology system of claim 1, wherein the x-ray measurement spot and the orientation measurement spot are coincident over an area of the semiconductor wafer.

5. The metrology system of claim 1, wherein the x-ray measurement spot and the orientation measurement spot are incident on the semiconductor wafer simultaneously.

6. The metrology system of claim 1, wherein the optical illumination source is laser based.

7. The metrology system of claim 1, further comprising:
a specimen positioning system configured to actively control an orientation of the semiconductor wafer about an axis orthogonal to an axis normal to a planar surface of the semiconductor wafer, wherein the specimen positioning system adjusts the orientation of the semiconductor wafer about the axis orthogonal to the axis normal to the planar surface of the semiconductor wafer based on the change in orientation of the semiconductor wafer at the orientation measurement spot measured by the orientation measurement system.

8. The metrology system of claim 1, further comprising:
a machine frame to which the optical illumination source, the optical detector, and the one or more focusing optical elements of the wafer orientation measurement system and the x-ray illumination source are attached.

9. The metrology system of claim 1, further comprising:
a first machine frame to which the optical illumination source, the optical detector, and the one or more focusing optical elements of the wafer orientation measurement system are attached;
a second machine frame to which the x-ray illumination source is attached, wherein the first machine frame moves with respect to the second machine frame.

10. The metrology system of claim 1, the computing system further configured to filter signals generated by the optical detector at the orientation measurements spot temporally, spatially, or a combination thereof.

11. The metrology system of claim 1, the computing system further configured to transform an estimate of an orientation of the semiconductor wafer at the orientation measurement spot from a time domain to a frequency domain, wherein the estimate of the orientation of the semiconductor wafer in the frequency domain is indicative of wafer modal dynamics and position stability during measurement.

12. A method comprising:
illuminating a semiconductor wafer with an x-ray illumination beam at an x-ray measurement spot;
detecting an amount of x-ray radiation from the semiconductor wafer in response to the incident x-ray illumination beam;
illuminating the semiconductor wafer with an optical illumination beam over an orientation measurement spot on the semiconductor wafer;
focusing an amount of light reflected from the semiconductor wafer in response to the incident optical illumination beam onto a photosensitive surface of a detector;
detecting light reflected from the semiconductor wafer in response to the incident optical illumination beam at the photosensitive surface of the detector;
estimating a change in orientation of the semiconductor wafer at the orientation measurement spot based on a change of a location of incidence of the light reflected from the semiconductor wafer on the photosensitive surface of the detector; and
determining a value of a parameter of interest characterizing a structure disposed on the semiconductor wafer based on the detected amount of x-ray radiation.

13. The method of claim 12, wherein the change in orientation of the semiconductor wafer at the orientation measurement spot is about an axis orthogonal to an axis normal to a planar surface of the semiconductor wafer.

14. The method of claim 12, wherein the x-ray measurement spot and the orientation measurement spot are coincident over an area of the semiconductor wafer.

15. The method of claim 14, wherein the x-ray measurement spot and the orientation measurement spot are incident on the semiconductor wafer simultaneously.

16. The method of claim 12, further comprising:
adjusting the orientation of the semiconductor wafer about the axis orthogonal to the axis normal to the planar surface of the semiconductor wafer based on the change in orientation of the semiconductor wafer at the orientation measurement spot measured by the orientation measurement system.

17. The method of claim 12, further comprising:
filtering signals generated by the optical detector at the orientation measurement spot temporally, spatially, or both.

18. The method of claim 12, further comprising:
transforming an estimate of an orientation of the semiconductor wafer at the orientation measurement spot from a time domain to a frequency domain, wherein the estimate of the orientation of the semiconductor wafer in the frequency domain is indicative of wafer modal dynamics and position stability during measurement.

19. A wafer orientation measurement system comprising:
an optical illumination source configured to generate an illumination beam directed to an orientation measurement spot on a semiconductor wafer;
an optical detector configured to detect light reflected from the semiconductor wafer in response to the incident optical illumination beam;
one or more focusing optical elements configured to focus the light reflected from the semiconductor wafer in response to the incident illumination beam onto the detector, wherein the detector is located at or near a focal plane of the one or more focusing optical elements; and
a computing system configured to estimate a change in orientation of the semiconductor wafer with respect to an x-ray illumination source at the orientation measurement spot based on a change of a location of incidence of the light reflected from the semiconductor wafer on the optical detector, wherein the x-ray illumination source is configured to generate an x-ray illumination beam incident on the semiconductor wafer at an x-ray measurement spot.

20. The wafer orientation measurement system of claim 19, wherein the x-ray measurement spot and the orientation measurement spot are coincident over an area of the semiconductor wafer.

21. The wafer orientation measurement system of claim 19, wherein the x-ray measurement spot and the orientation measurement spot are incident over the area of the semiconductor wafer simultaneously.

22. The wafer orientation measurement system of claim 19, wherein the optical illumination source is laser based.

23. The wafer orientation measurement system of claim 19, the computing system further configured to filter signals generated by the optical detector at the orientation measurements spot temporally, spatially, or a combination thereof.

24. The wafer orientation measurement system of claim 19, the computing system further configured to transform an estimate of an orientation of the semiconductor wafer at the orientation measurement spot from a time domain to a frequency domain, wherein the estimate of the orientation of the semiconductor wafer in the frequency domain is indicative of wafer modal dynamics and position stability during measurement.

* * * * *